(12) United States Patent
Kotek et al.

(10) Patent No.: US 7,250,343 B2
(45) Date of Patent: Jul. 31, 2007

(54) POWER TRANSISTOR ARRANGEMENT AND METHOD FOR FABRICATING IT

(75) Inventors: Manfred Kotek, Villach (AT); Oliver Häberlen, Villach (AT); Martin Pölzl, Ossiach (AT); Walter Rieger, Arnoldstein (AT)

(73) Assignee: Infineon Technologies AG, Munich (DE)

( * ) Notice: Subject to any disclaimer, the term of this patent is extended or adjusted under 35 U.S.C. 154(b) by 131 days.

(21) Appl. No.: 10/987,189

(22) Filed: Nov. 12, 2004

(65) Prior Publication Data

US 2005/0151190 A1 Jul. 14, 2005

(30) Foreign Application Priority Data

Nov. 14, 2003 (DE) ................. 103 53 387

(51) Int. Cl.
*H01L 21/336* (2006.01)
(52) U.S. Cl. ............... 438/270; 257/330; 257/341; 257/E21.418
(58) Field of Classification Search ............ 438/270; 257/330, 341, E21.418
See application file for complete search history.

(56) References Cited

U.S. PATENT DOCUMENTS

| | | | |
|---|---|---|---|
| 4,791,462 A * | 12/1988 | Blanchard et al. | 257/260 |
| 6,388,286 B1 * | 5/2002 | Baliga | 257/330 |
| 6,413,822 B2 * | 7/2002 | Williams et al. | 438/270 |
| 6,462,376 B1 | 10/2002 | Wahl et al. | |
| 6,690,062 B2 | 2/2004 | Henninger et al. | |
| 6,720,616 B2 * | 4/2004 | Hirler et al. | 257/330 |
| 6,870,220 B2 * | 3/2005 | Kocon et al. | 257/340 |
| 2002/0102795 A1 * | 8/2002 | Calafut | 438/259 |
| 2003/0178676 A1 * | 9/2003 | Henninger et al. | 257/340 |
| 2003/0222297 A1 | 12/2003 | Krumrey et al. | |

FOREIGN PATENT DOCUMENTS

| | | |
|---|---|---|
| DE | 102 12 144 A1 | 10/2003 |
| DE | 102 12 149 A1 | 10/2003 |
| WO | WO 00/42665 A1 | 7/2000 |

OTHER PUBLICATIONS

Widmann et al., "Technologie Hochintegrierter Schaltungen", Springer, 1996, (4 pages).

* cited by examiner

*Primary Examiner*—B. William Baumeister
*Assistant Examiner*—Steven J. Fulk
(74) *Attorney, Agent, or Firm*—Maginot, Moore & Beck

(57) ABSTRACT

In the case of the cost-effective method according to the invention for fabricating a power transistor arrangement, a trench power transistor arrangement (1) is fabricated with four patterning planes each containing a lithography step. The power transistor arrangement according to the invention has a cell array (3) with cell array trenches (5) each containing a field electrode structure (11) and a gate electrode structure (10). The field electrode structure (11) is electrically conductively connected to the source metallization (15) by a connection trench (6) in the cell array (3).

23 Claims, 20 Drawing Sheets

FIG 3A I
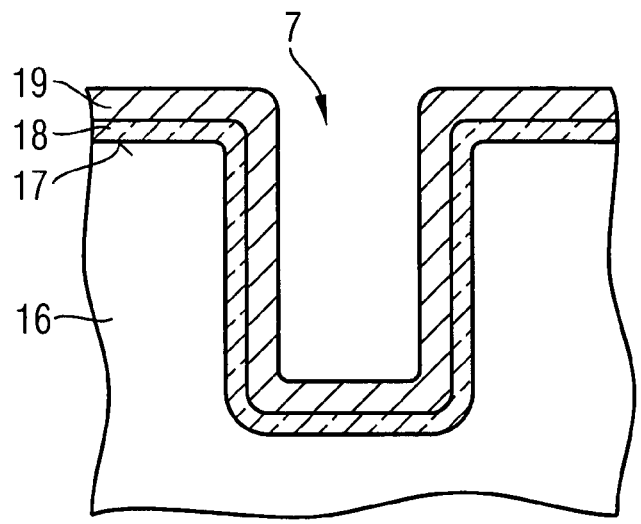
FIG 3A II
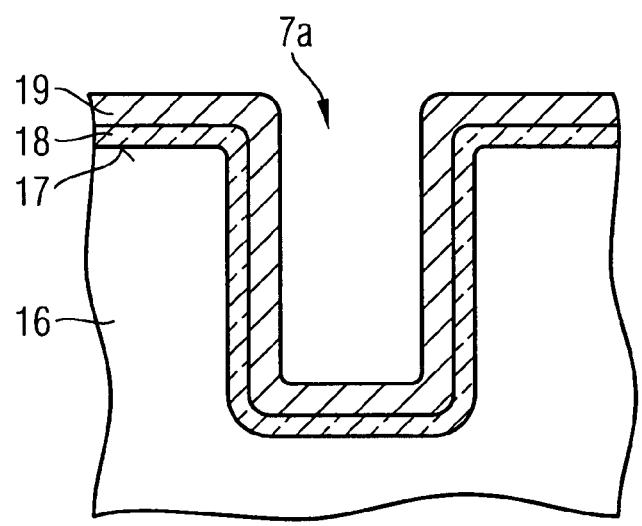
FIG 3A III
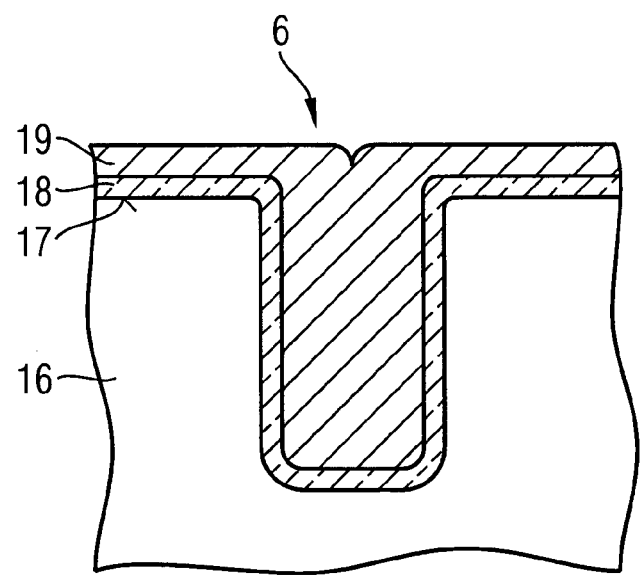

FIG 3A IV
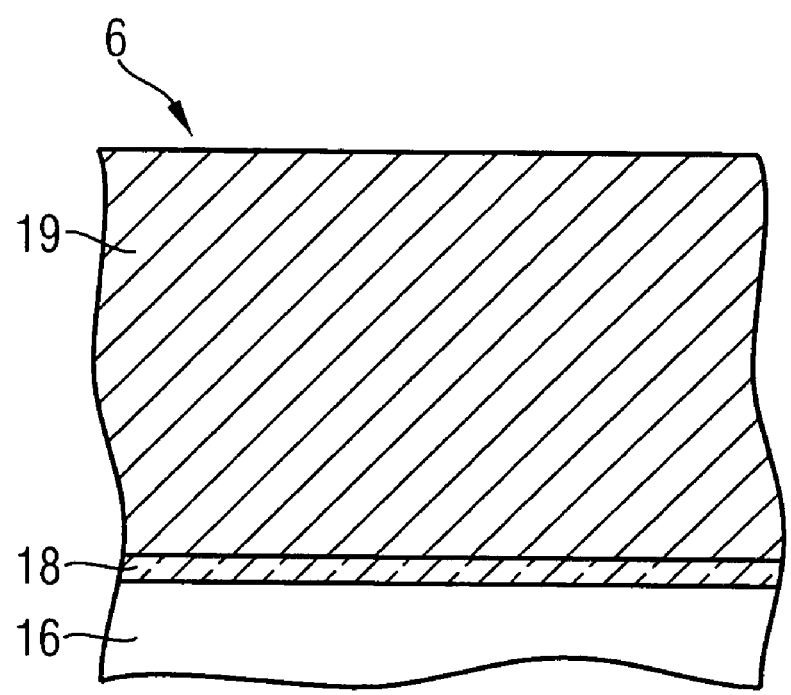
FIG 3A V
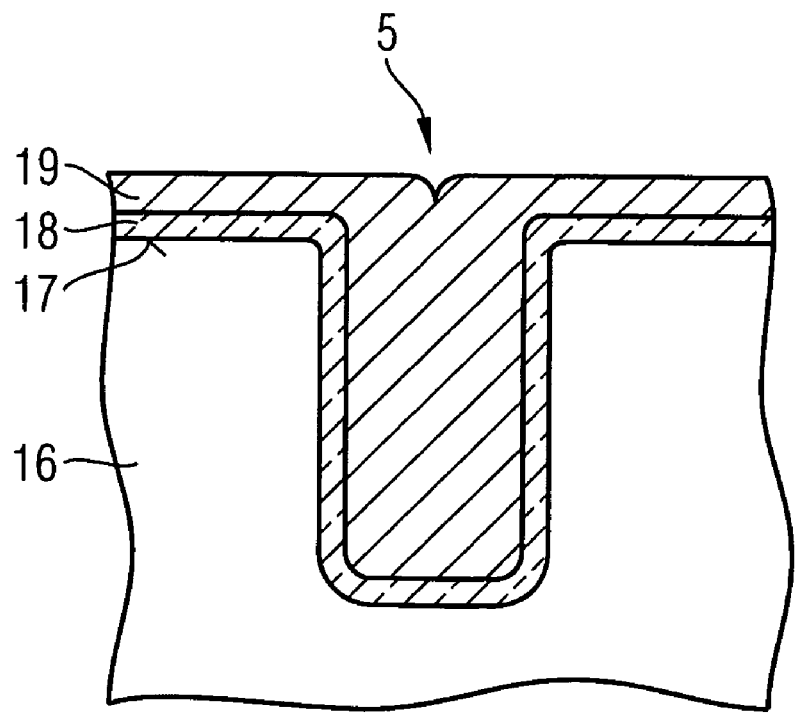

FIG 3B I
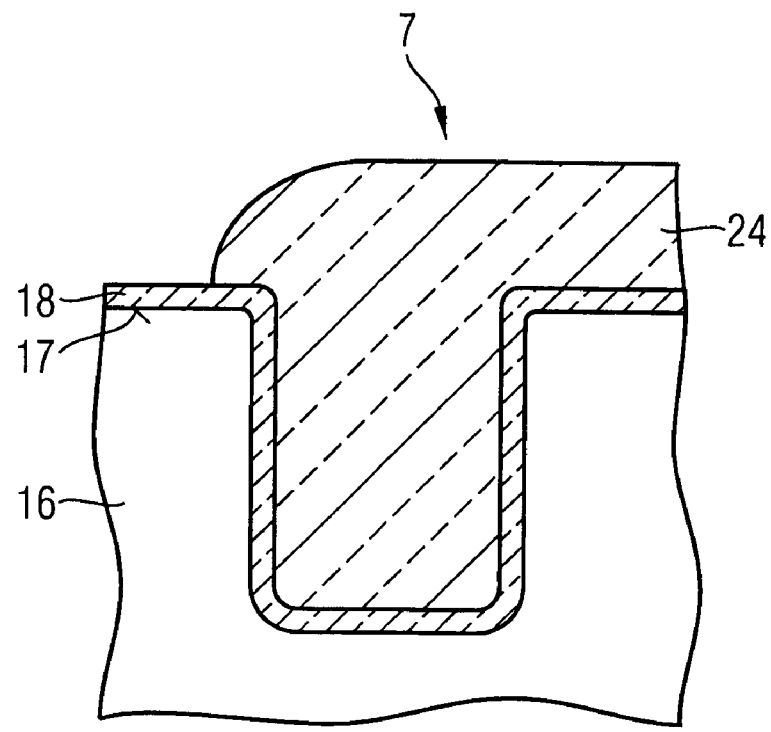
FIG 3B II
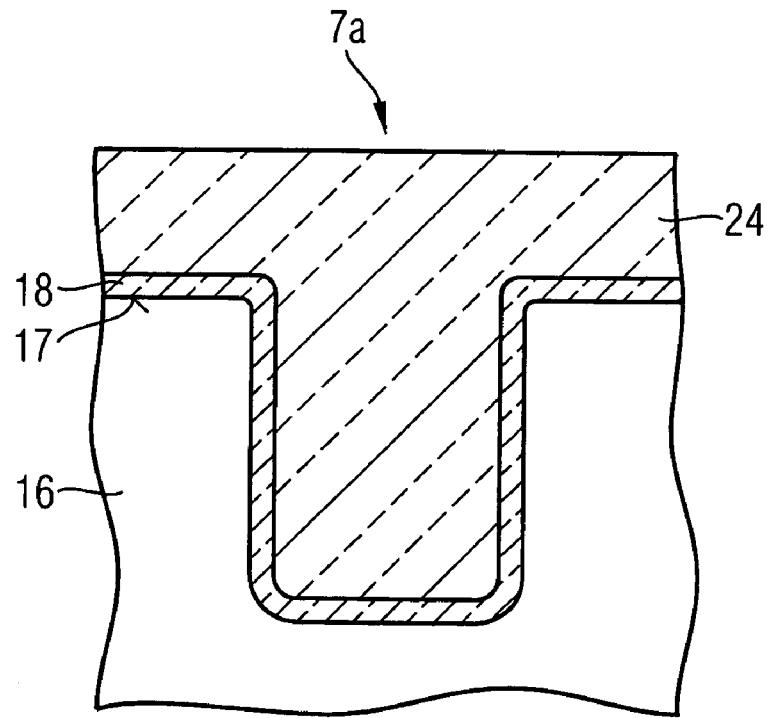

FIG 3B III
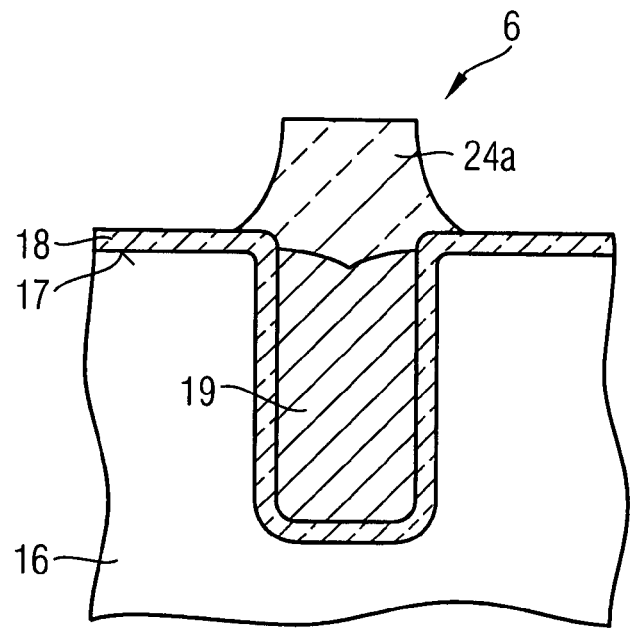
FIG 3B IV
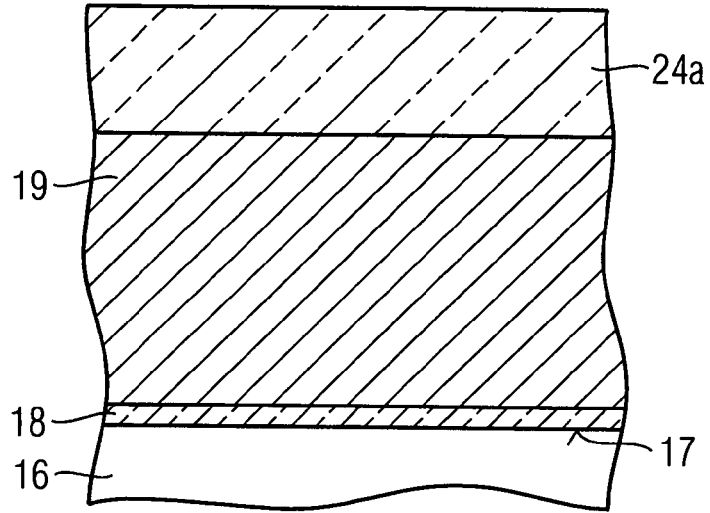
FIG 3B V
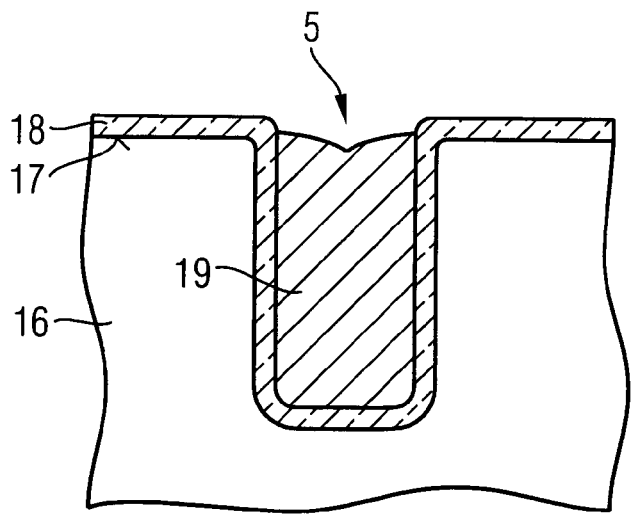

FIG 3C I
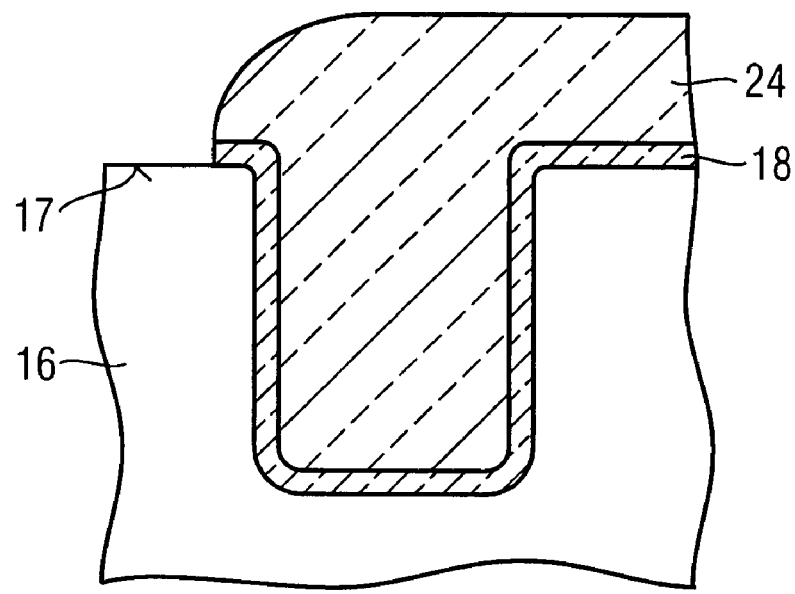
FIG 3C II
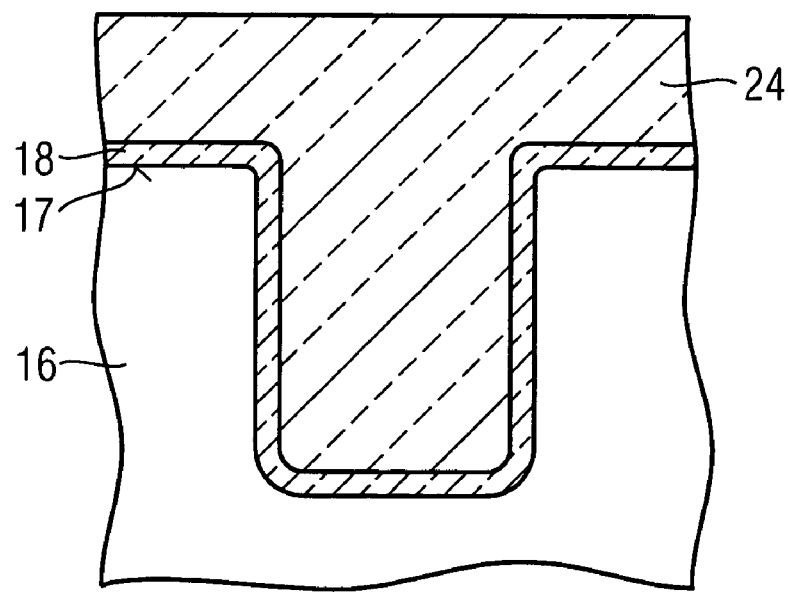

FIG 3C III
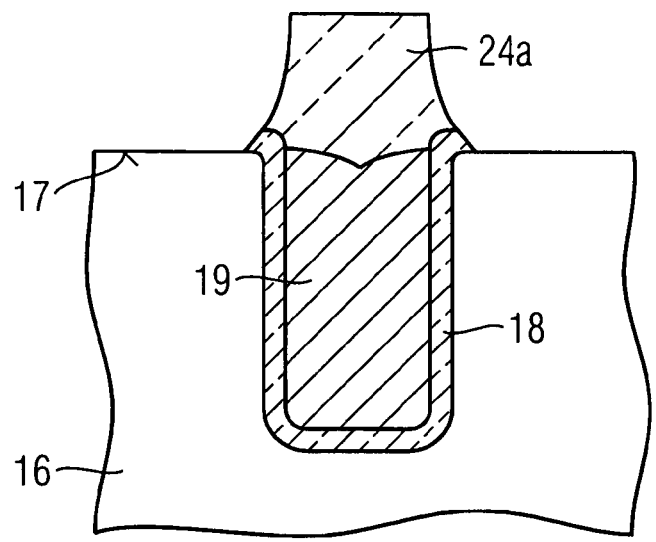
FIG 3C IV
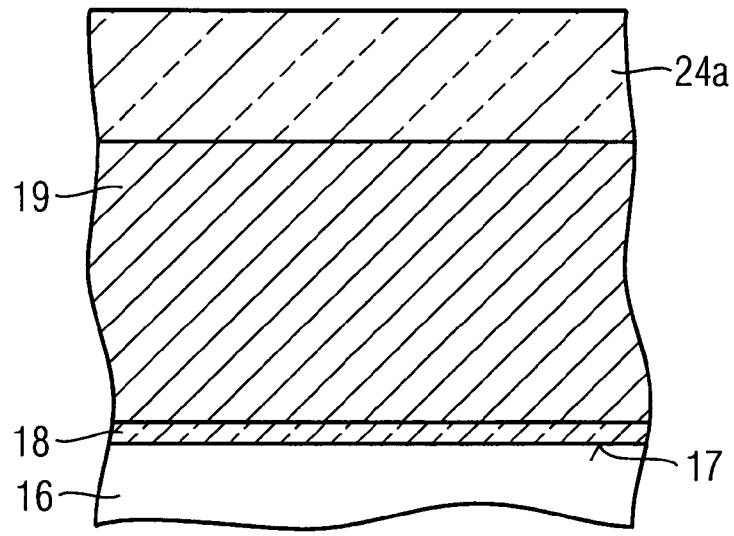
FIG 3C V
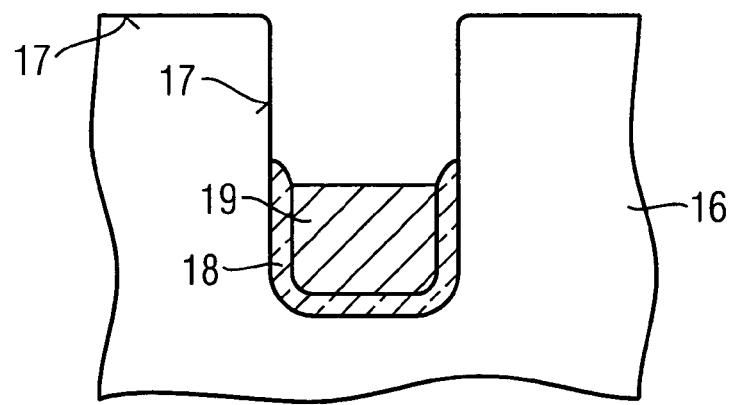

FIG 3D I
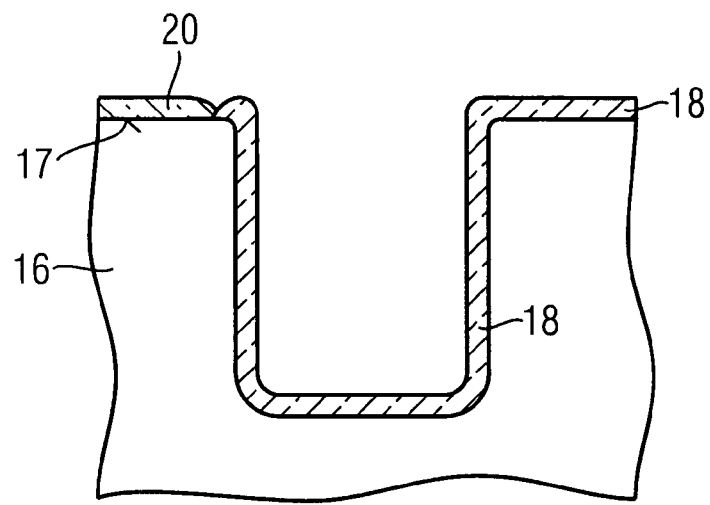
FIG 3D II
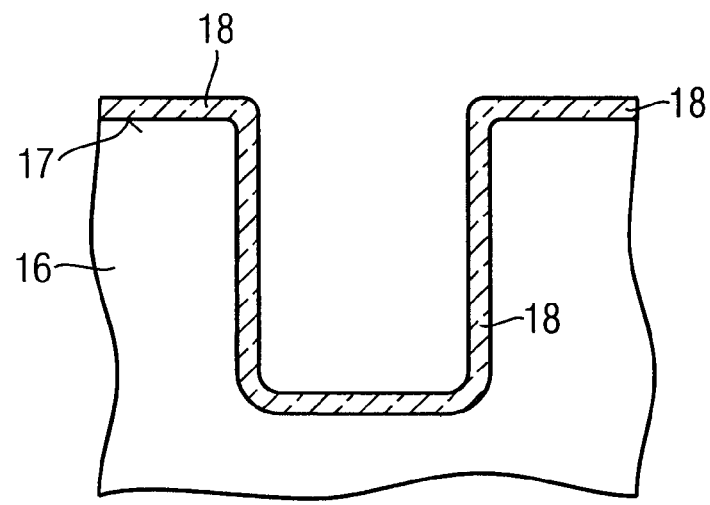
FIG 3D III
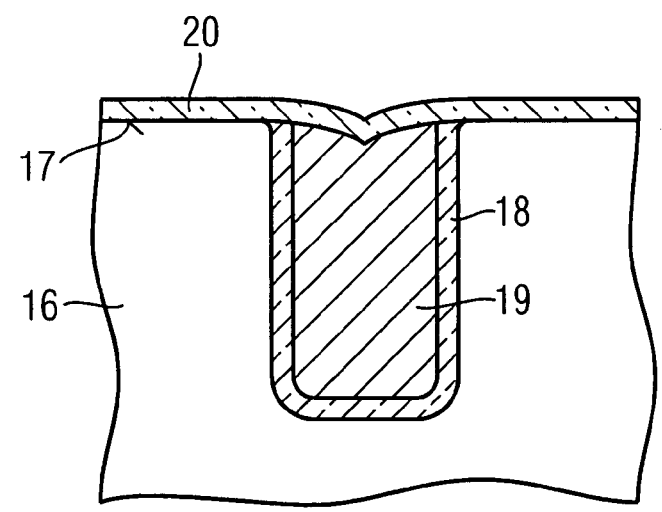

FIG 3D IV
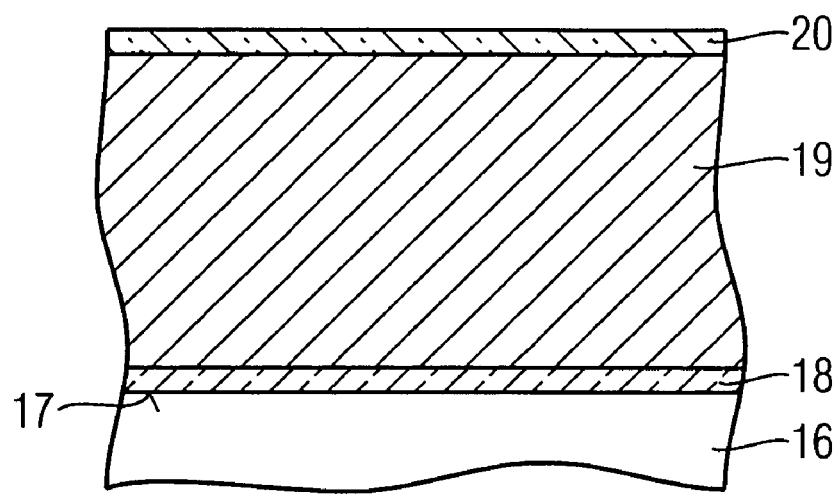
FIG 3D V
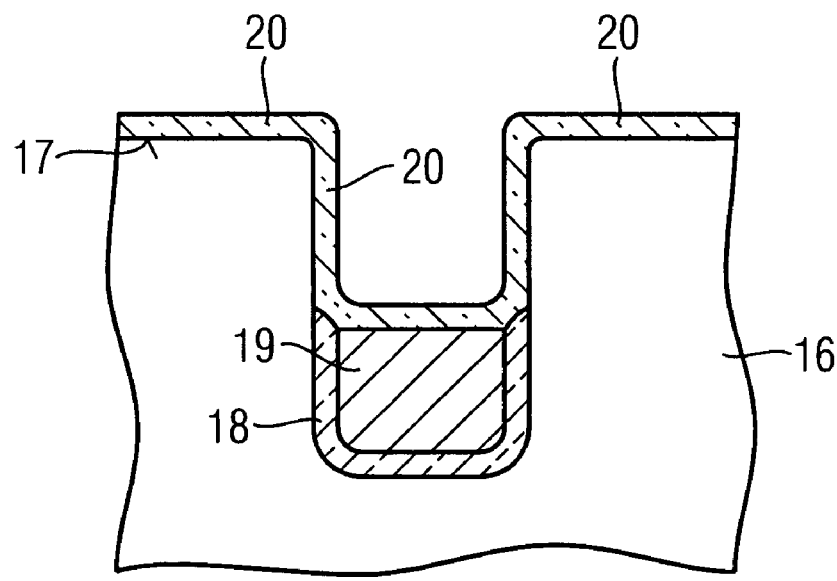

FIG 3E I
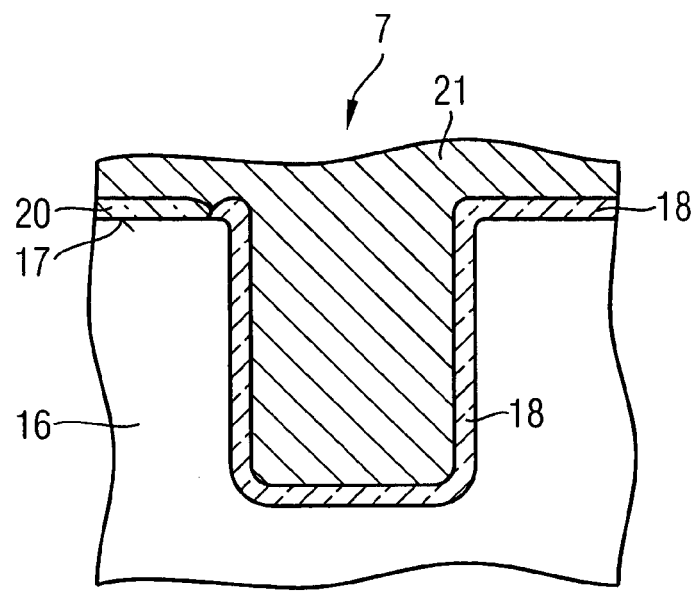
FIG 3E II
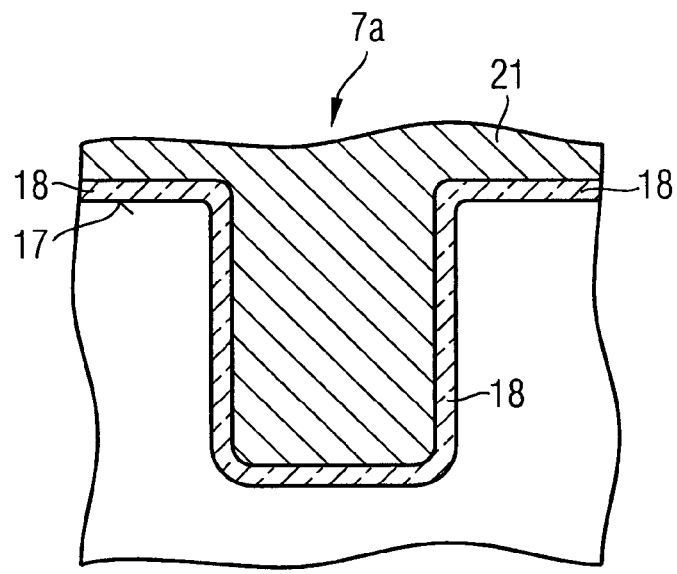
FIG 3E III
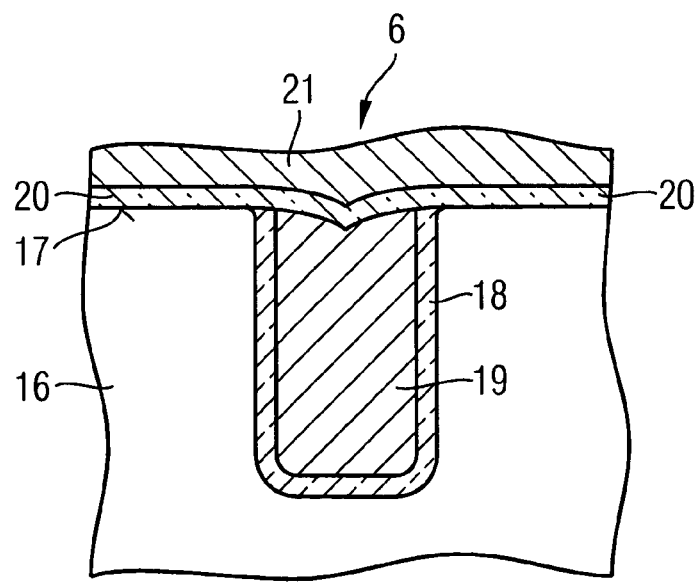

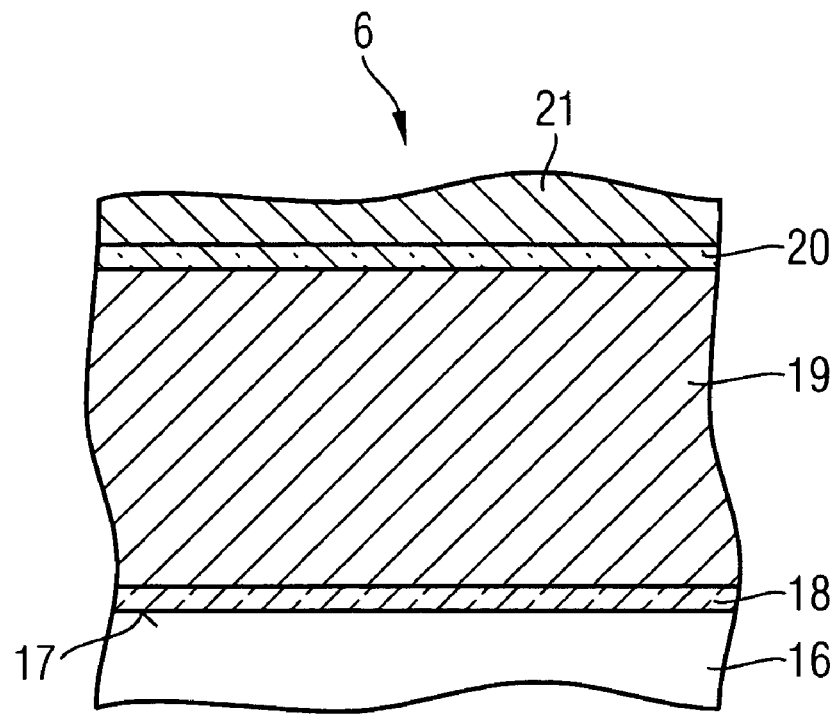
FIG 3E IV
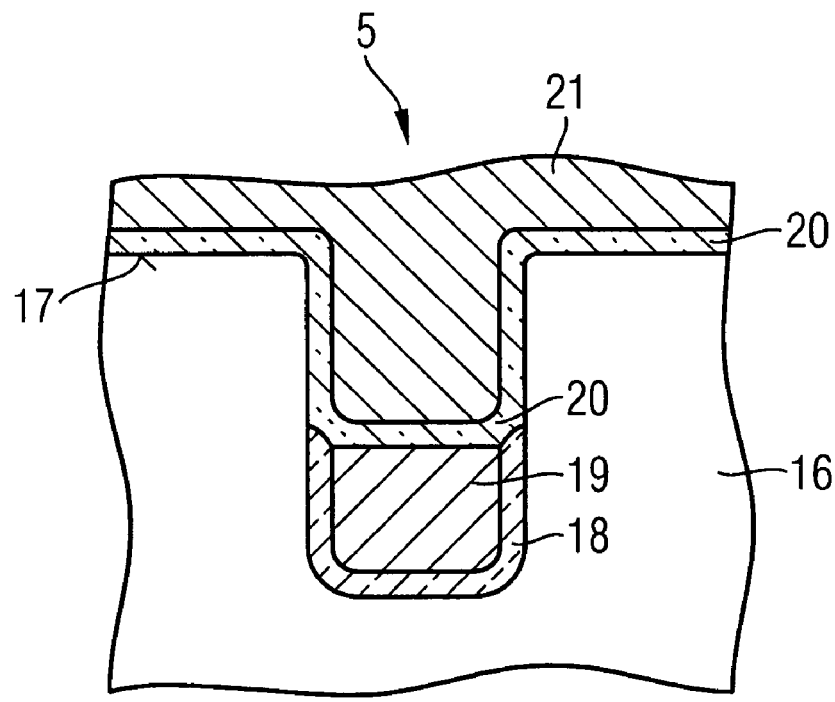
FIG 3E V

FIG 3F I
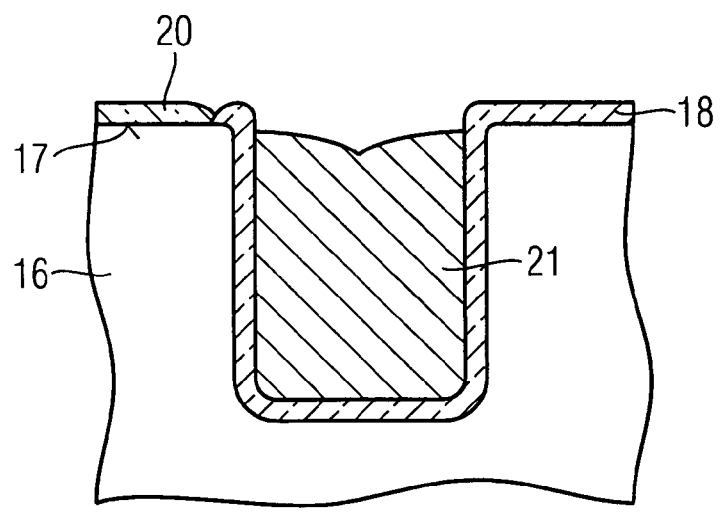
FIG 3F II
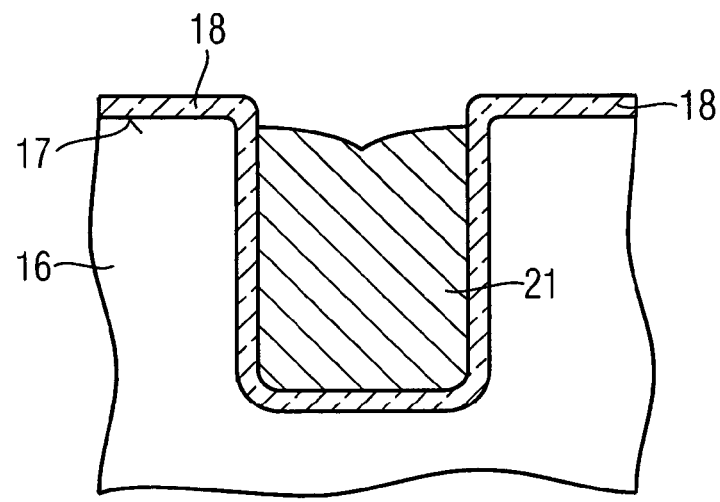
FIG 3F III
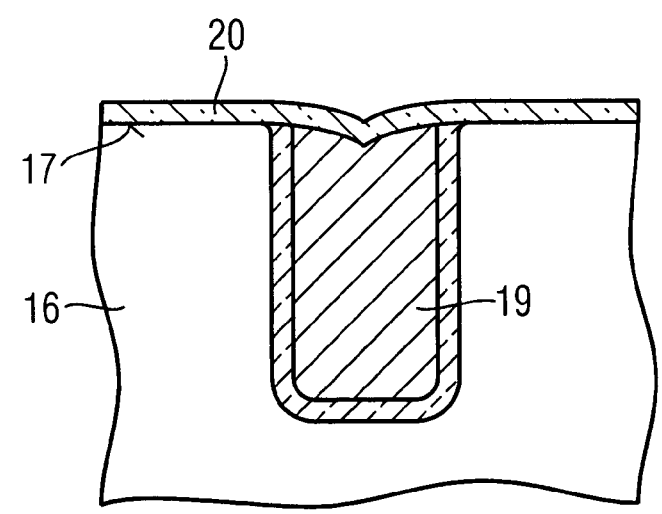

FIG 3F IV
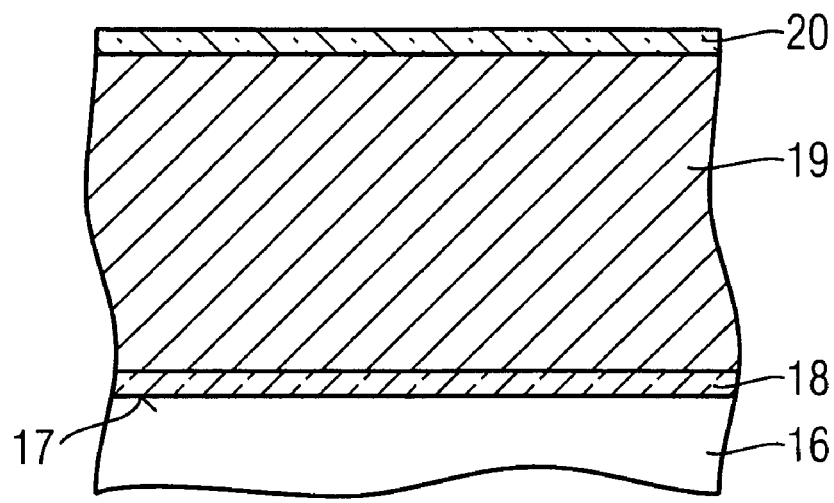
FIG 3F V
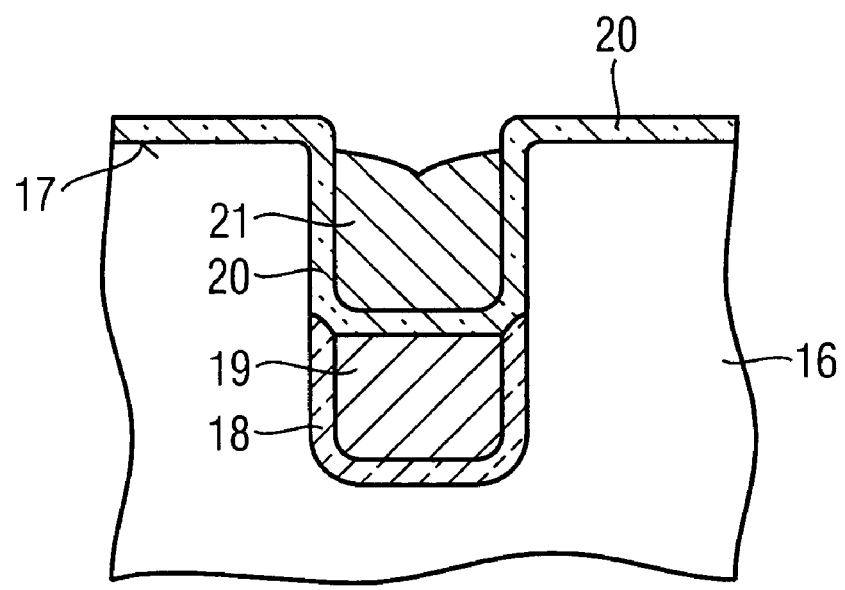

FIG 3G I
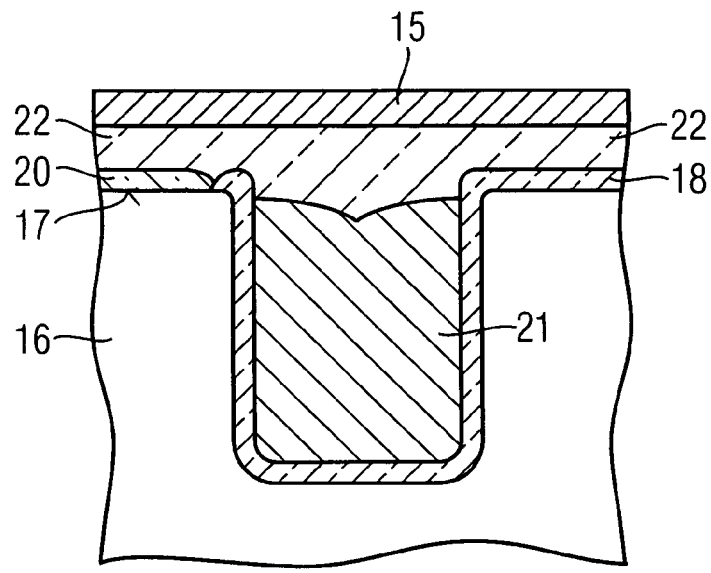
FIG 3G II
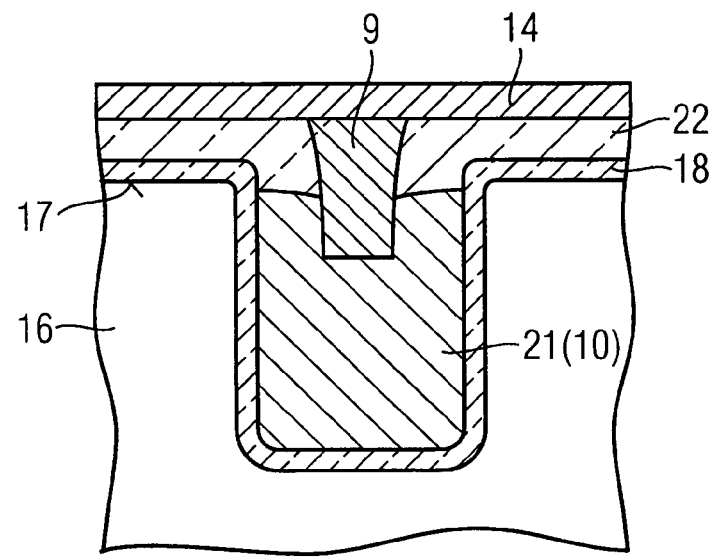
FIG 3G III
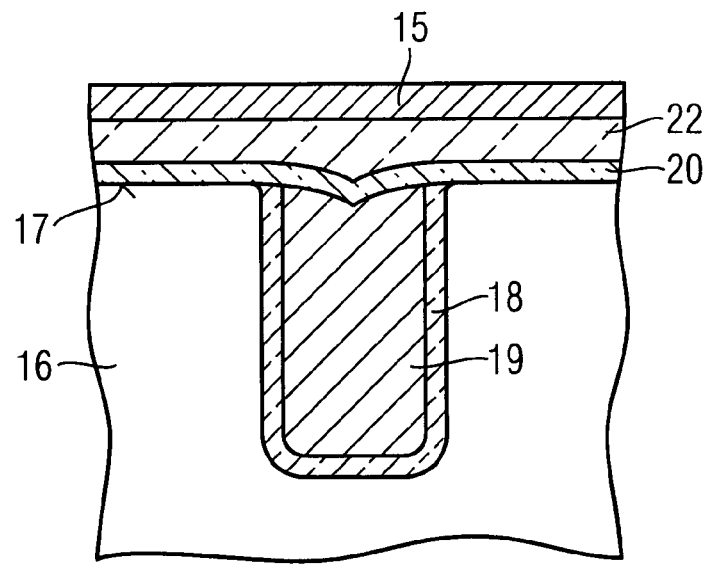

FIG 3G IV
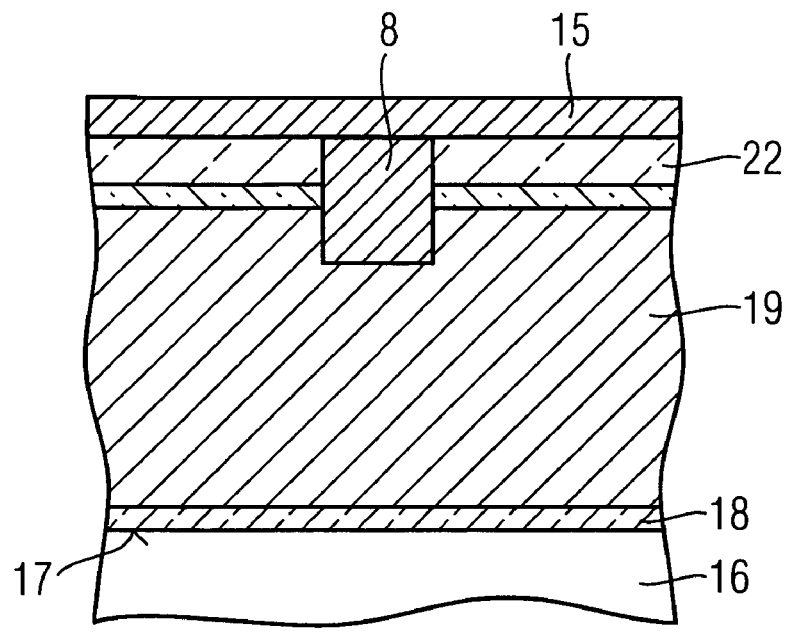
FIG 3G V
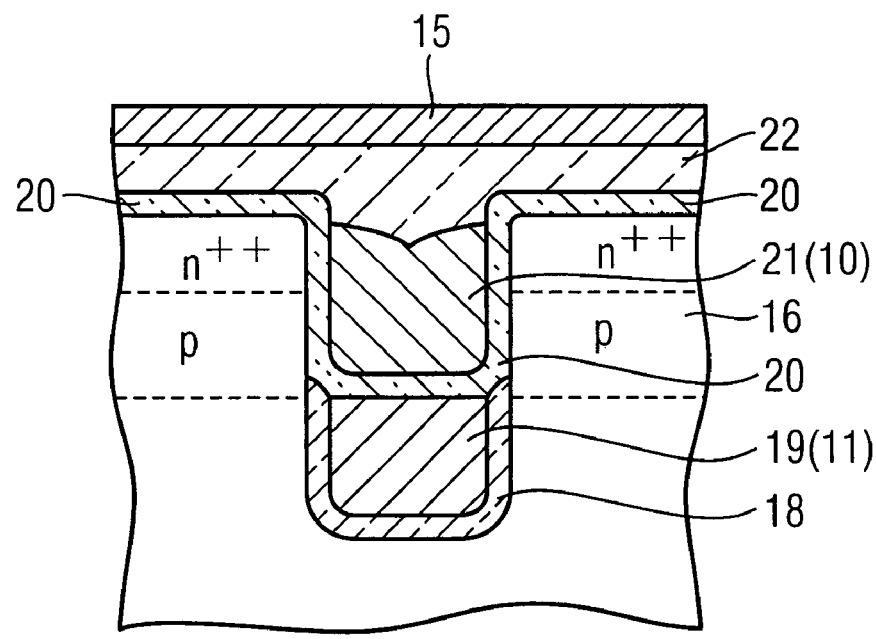

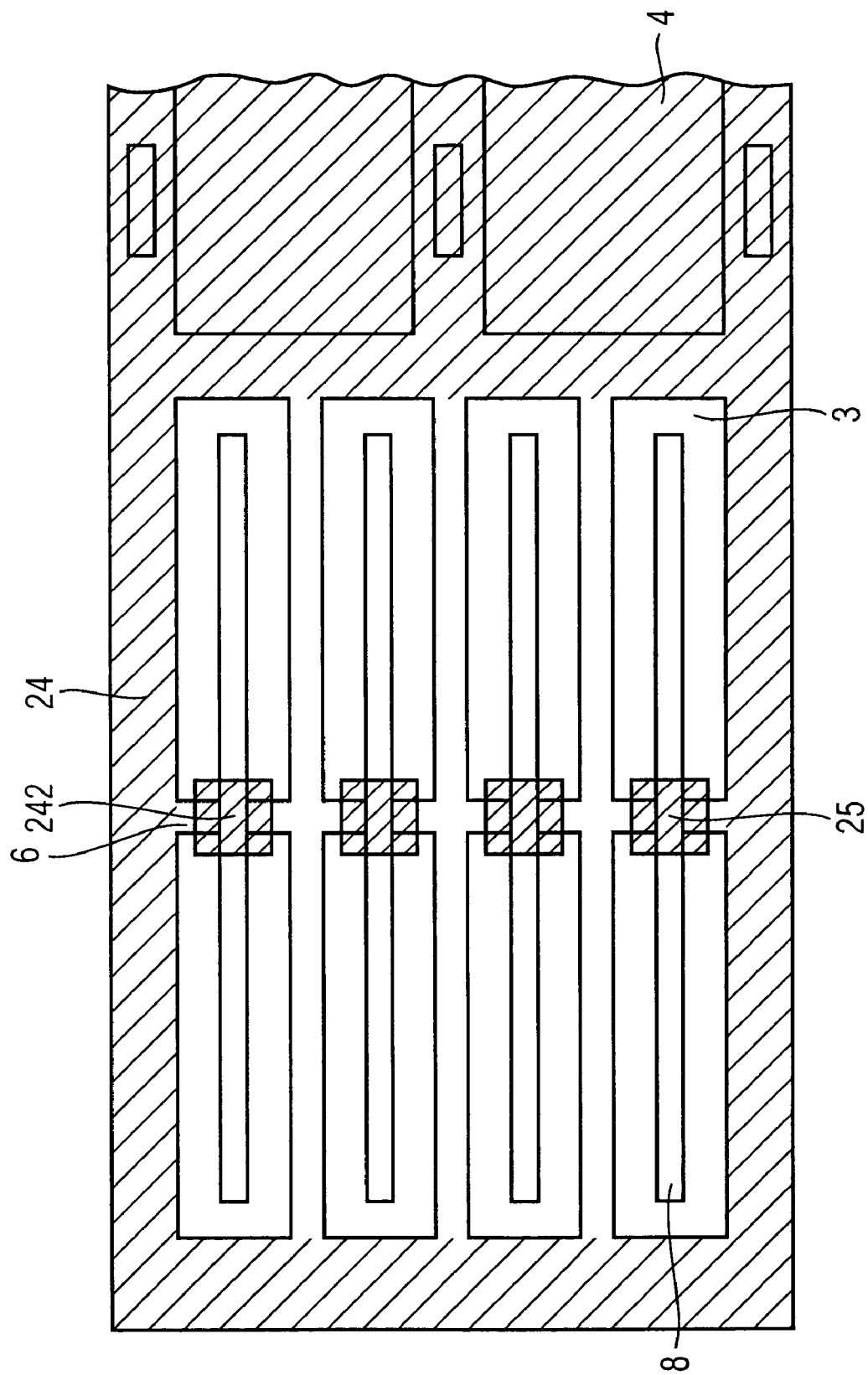

POWER TRANSISTOR ARRANGEMENT AND METHOD FOR FABRICATING IT

BACKGROUND

The invention relates to a method for fabricating a power transistor arrangement and a mask for carrying out the method. Moreover, the invention relates to a power transistor arrangement.

Transistor arrangements fashioned as MOS (Metal Oxide semiconductor) power transistors are provided for controlling switching currents having high current intensities (up to several tens of amperes) by means of low control voltages. The dielectric strength of such power transistors may be as much as several 100 V. The switching times are usually in the region of a few microseconds.

MOS power transistors take the form of trench MOS power transistors, for example. A trench MOS power transistor is formed in a semiconductor substrate having, in at least one active cell array, in each case a plurality of trench transistor cells arranged next to one another.

Depending on the fashioning of the trench transistor cells, it is possible to realize for example normally on and normally off p-channel and n-channel trench MOS power transistors.

FIG. 1 shows a conventional power transistor arrangement 1 embodied as a trench MOS power transistor with a schematic illustration of the source, drain and gate connections, which is embodied as an n-channel MOSFET with a vertical double-diffused trench structure (VDMOSFET, vertical double-diffused metal oxide semiconductor field effect transistor). In this case, a drain metallization 231 connected to the drain connection is arranged on a rear side of a semiconductor substrate 16. An $n^{++}$-doped drain layer 23 adjoins the drain metallization 231 in the semiconductor substrate 16. A drift zone 232 adjoins the drain layer 23 opposite to the drain metallization 231. The drift zone 232 is generally formed from a weakly n-doped semiconductor substrate 16 that generally comprises silicon applied epitaxially. A space charge zone forms in the drift zone 232 during off-state operation of the trench MOS power transistor, the extent of said space charge zone essentially determining the maximum reverse voltage.

In a cell array 3, cell array trenches 5 are arranged in the semiconductor substrate 16. The cell array trenches 5, which are illustrated in cross section, in this example extend parallel in a direction perpendicular to the cross-sectional area. Gate electrode structures 10 and field electrode structures 11 are arranged in the cell array trenches 5. The field electrode structure 11 is insulated from the semiconductor substrate 16 by an insulation layer 18, which may comprise a field oxide, for example. The gate electrode structure 10 is insulated from the field electrode structure 11 and the semiconductor substrate 16 by a gate insulation layer 20, which may be a silicon oxide, for example. The drift zone 232 of the semiconductor substrate 16 is adjoined by p-doped body zones in regions between the cell array trenches 5, said body zones approximately being situated opposite the gate electrode structures 10. $n^{++}$-doped source regions 8a are provided between the body zones and a substrate surface 17. The field electrode structures 11 reduce a parasitic capacitance between the gate electrode structures 10 and the drift zone 232. A source metallization 15 is electrically conductively connected to the source regions 8a by means of source contact trenches 8. The source metallization 15 is electrically insulated with respect to the gate electrode structures 10 by an intermediate oxide layer 22.

The material both of the gate electrode structures 10 and of the field electrode structures 11 is heavily doped polysilicon, for example. The conductivity of the gate electrode structure 10 may be improved for example by an additional layer in the gate electrode structure 10, for instance a silicide layer. The cell array trench 5 with the gate electrode structure 10 and the field electrode structure 11 forms, together with the adjoining doped regions of the semiconductor substrate 16, a trench transistor cell 2 extending as far as the drain layer 23.

If a positive potential is applied to the gate electrode structure 10 in such an active trench transistor cell 2, then an n-conducting inversion channel forms in the p-doped body zone from the minority carriers (electrons) of the p-doped body zone that have accumulated there.

In an edge region 4 of the power transistor arrangement 1 formed as a trench MOS power transistor, on the one hand the field electrode structures 11 arranged in the cell array trenches 5 are contact-connected to the source metallization 15, and on the other hand the gate electrode structures 10 arranged in the cell array trenches 5 are contact-connected to a gate metallization 14. Furthermore, an example of a shielding electrode 12 is illustrated in the edge region 4.

By way of example, the field electrode structures 11 arranged in the cell array trenches 5 are contact-connected in a cross-sectional plane VII parallel to the cross-sectional plane VI. In the cell array trenches 5, running perpendicular to the cross-sectional plane VI, the gate electrode structures 10 do not extend over the entire length of the cell array trenches 5, so that the respective field electrode structure 11 is contact-connected in a connection region of the cell array trenches 5, as shown in the plane VII. Each field electrode structure 11 pulled over the substrate surface 17 is electrically conductively connected to the source metallization 15. Moreover, a shielding electrode 12 extending above the substrate surface 17 is formed.

In a further cross-sectional plane VIII extending between the first cross-sectional plane VI and the second cross-sectional plane VII parallel thereto, the gate electrode structures 10 are electrically connected to an edge gate structure 13. The edge gate structure 13 is electrically conductively connected to the gate metallization 14. The edge gate structures 13 and the shielding electrodes 12 are generally formed from doped polysilicon. The source metallization 15, the gate metallization 14, the edge gate structure 13, the shielding electrode 12, and also the semiconductor substrate 16 are mutually insulated from one another in each case by an insulation layer 18, an intermediate oxide layer 22 and also a further insulation layer 18.

In order to fabricate a complex structure, such as the power transistor arrangement described in FIG. 1, in which both the gate electrode structure and the field electrode structure are led out into the edge region and connected there in each case to a gate metallization, and a source metallization, respectively, at least five to seven patterning planes are employed in the present-day fabrication methods. A patterning plane generally comprises a lithographic imaging of structures that are predefined on an exposure mask onto the semiconductor substrate to be patterned and subsequent etching, deposition or growth and planarization steps.

The at least seven patterning planes for fabricating a power transistor arrangement such as has been described in FIG. 1, for example, contain a trench patterning, during which cell array and edge trenches are introduced into the semiconductor substrate, a patterning of deposited polysilicon for formation of the field electrode structure, a patterning of a gate insulation layer (gate oxide), a patterning of a second deposited polysilicon layer for formation of the gate electrode structure, a patterning of body and source regions, a patterning of contact holes, and a patterning of a metal plane.

A major cost factor in each patterning plane is the lithographic imaging, since the requisite devices are technically very complicated and cost-intensive. Moreover, the entire imaging process requires a high precision and is thus highly susceptible to error. For the reasons mentioned, it is endeavored to reduce the number of lithographic imagings and thus also the number of patterning planes.

A fabrication method with only five patterning planes has already been proposed. In the method, the body and source patterning and also gate electrode patterning planes are eliminated. Lithographic imagings are then not used any longer either for body patterning, source patterning or for gate electrode patterning. The remaining five patterning planes comprise the trench patterning, the field electrode patterning, the patterning of the gate insulation layer, the contact hole patterning and the patterning of the metal plane.

The present invention is based on the object of providing a cost-effective method with a further reduced number of patterning planes for fabrication of a power transistor arrangement. Moreover, it is an object of the invention to provide a mask for carrying out the method. The object further encompasses a power transistor arrangement fabricated by the method.

This object is achieved by means of a method having the features of patent claim 1 and by means of a mask for carrying out the method in accordance with patent claim 14. Furthermore, the object is achieved by means of a power transistor arrangement in accordance with patent claim 23. Advantageous developments of the invention emerge from the respective subclaims.

SUMMARY

A method for fabricating a power transistor arrangement is provided, in which a cell array and an edge region adjoining the cell array are provided in a semiconductor substrate. There are introduced, within the cell array, cell array trenches, and also at least one connection trench crossing the cell array trenches, and, in the edge region, at least one edge trench adjoining the cell array trenches. In this case, the edge trench is provided such that it is wider than the cell array trenches and the connection trench. An insulation layer is applied, and a first conductive layer is applied to the insulation layer, the cell array trenches and the connection trench at least being filled and the wider edge trench not being completely filled. The first conductive layer is completely removed from the edge trenches and is caused to recede in the cell array essentially as far as the substrate surface. A mask covering the edge region and the connection trench is applied. In sections not covered by the mask, the first conductive layer is caused to recede in the cell array trenches. A gate insulation layer is provided in sections not covered by the mask in the cell array trenches above the first conductive layer that has been caused to recede and forms a field electrode structure. A contact connection of the field electrode structure is implemented in the region of the connection trench.

The method according to the invention for fabricating a power transistor arrangement advantageously requires just four pattering planes with a respective lithographic imaging. In the first patterning plane, the cell array trenches, the connection trenches and the edge trenches are introduced into the semiconductor substrate by means of a lithographic imaging and subsequent etching processes. In this case, the width of the trenches is to be provided such that the edge trenches are wider than the cell array trenches and the connection trench. By way of example, the edge trenches may be provided with 1.5 to 2 times the width of the cell array and connection trenches. An insulation layer, for example a field oxide, is applied to the then patterned substrate surface. Furthermore, a first conductive layer is applied to the insulation layer in the first patterning plane. This may be done by conformal deposition of doped polysilicon, the cell array trenches and the connection trench at least being filled and the wider edge trench being lined but not completely filled with the doped polysilicon. The width ratio of the edge trenches to the cell array trenches and the connection trenches is designed such that the first conductive layer is completely removed from the edge trenches by means of an etching process and is caused to recede in the cell array essentially as far as the substrate surface. In the subsequent second patterning plane, a mask covering the edge region and the connection trench is patterned by means of a lithographic imaging. In the sections not covered by the mask, the first conductive layer is caused to recede in the cell array trenches and a field electrode structure is formed. Furthermore, in this patterning plane, wet-chemical etching of the field oxide defines a region on which a gate insulation layer is later formed, for example by growth of a gate oxide. A contact connection of the field electrode structure in the region of the connection trench, and also the contact connection of source regions in the cell array and the contact connection of a gate electrode in the edge region of the power transistor arrangement are effected in a third patterning plane. The provision of a metal plane is effected in a fourth patterning plane.

In the method according to the invention, two patterning planes, namely the patterning of the field electrode structure and the patterning of the gate insulation layer, are advantageously combined into one patterning plane. An item of information that was conventionally transmitted by a lithographic imaging is communicated in the trench width. The edge trenches and the cell array trenches are patterned with different widths, which has the effect that the edge trenches remain open when the cell array trenches and the connection trench, which is provided for example with the same width as the cell array trenches, are completely filled with the first conductive layer. The edge trenches are completely emptied after the first conductive layer has been etched back. By means of the lithographically patterned mask according to the invention that is employed in the method, both the field electrode structure and the gate insulation layer are patterned in one patterning plane.

The method additionally provides a connection trench according to the invention which crosses the cell array trenches and connects the field electrode structure directly in the cell array to the source metallization arranged above the cell array.

This avoids leading out the field electrode structure into the edge trench, whereby it is possible to reduce a complexity in the patterning and thus also the requirements made of the lithography processes of the subsequent patterning planes.

An essential advantage of the method according to the invention is that the number of patterning planes is reduced from five to four, thereby saving a lithographic imaging. As a result, the number of error sources is reduced and both costs and time are saved.

In an advantageous manner, for the patterning of the gate insulation layer, sections of the insulation layer that are covered neither by the mask nor by the first conductive layer are removed. The mask is then removed and the gate insulation layer is provided by means of an oxidation of semiconductor material. Both the mask and the first conductive layer mask the insulation layer. The non-masked sections of the insulation layer are removed. After the removal of the mask, the gate insulation layer is applied by means of a virtually self-aligning process since a gate oxide layer formed by the oxidation is formed only in connection with the semiconductor material. The gate oxide layer is formed on the semiconductor substrate and on, for example, a polysilicon of the first conductive layer forming the field electrode structure.

Preferably, after the application of the gate insulation layer, a second conductive layer is applied for forming a gate electrode structure. The second conductive layer is etched back as far as the substrate surface, so that the cell array trenches are completely filled. An intermediate oxide layer is applied for insulation purposes. There are provided, in the intermediate oxide layer, in the cell array, source contact trenches for the contact connection of source regions and of the connection trench, and also, in the edge region, gate contact holes for the contact connection of the gate electrode structure. A gate metallization is then provided above the edge region and a source metallization is provided above the cell array. Both source contact trenches and gate contact holes may be filled with a metal or with a doped polysilicon.

In an advantageous manner, provision is made of gate connection trenches adjoining the edge trenches, the gate connection trenches being provided with the width of the edge trenches. The gate connection trenches and the edge trenches can thereby be treated in the same way. The gate connection trenches are also completely freed of the first conductive layer and completely filled with the second conductive layer forming the gate electrode structure.

Preferably, a field oxide is deposited or grown for the purpose of applying the insulation layer.

Preferably, doped polysilicon is deposited conformally for the purpose of applying the first conductive layer. In the case of a conformal deposition process, the cell array trenches and the connection trench are advantageously filled more rapidly than the wider edge trenches. Given a suitable width ratio between edge trenches and cell array trenches, the process can be set such that after a specific time during which the polysilicon is deposited conformally, the cell array trenches and the connection trench are completely filled, while the wider edge trenches are lined with the polysilicon with a defined layer thickness and an opening remains.

Preferably, an isotropic etching process is employed for the first instance of causing the first conductive layer to recede before the application of the mask.

Preferably, an isotropic dry etching process is used for the purpose of forming the field electrode structure during the second instance of causing the first conductive layer to recede using the mask. An undercut of the mask can advantageously be achieved by means of an isotropic etching process. This is favorable in partial regions of the connection trench since the polysilicon of the first conductive layer is to be caused to recede at the crossover locations between the cell array trenches and the connection trenches in order that the polysilicon of the second conductive layer forming the gate electrode structure is located in the cell array trench at the crossover locations above the polysilicon of the first conductive layer and the gate electrode structures are through-connected in the region of the crossover locations on the left and right of the connection trench.

Preferably, the uncovered insulation layer is removed by means of a wet-chemical etching process.

Preferably, doped polysilicon is provided as material for the second conductive layer.

In an advantageous manner, the second conductive layer is applied by means of a conformal deposition process. A thickness of the second conductive layer is provided in such a way that the edge trenches and the gate connection trenches are essentially filled. This is necessary since the gate electrode structures are electrically conductively connected by the edge trenches and the gate connection trenches to the gate metallization by means of gate contact holes filled with conductive material.

Preferably, body and source regions are introduced into the semiconductor substrate by an implantation of atoms and a subsequent thermal step.

Preferably, for application of the mask, a photosensitive resist layer is applied to a surface to be processed. A structure provided for the mask is imaged onto the resist layer by means of an exposure mask having the structure and a lithography method, and the resist layer is subsequently patterned by means of an etching process.

The mask according to the invention for carrying out the method according to the invention essentially covers the edge region and coves the connection trench at least in sections. In the case of etching processes that are customary at the present time, it is expedient to cover the connection trench at least in the region of crossover locations between the connection trench and source contact trenches that are processed later. Since, at said crossover locations, the connection trench is contact-connected to the source metallization by the source contract trench, the polysilicon of the first conductive layer in the connection trench, at least in the region of said crossover location, is led to the substrate surface and should not be removed during the etching process for forming the field electrode structure.

Preferably, the mask is provided with a ridge covering the connection trench and having a width of essentially the width of the connection trench. When carrying out the method according to the invention using this mask, an undercut under the ridge covering the connection trench may occur if the ridge is provided such that it is too narrow. As a result, both the insulation layer and the material of the first conductive layer in the connection trench may be removed to such an extent that there is no longer a connection to the source contact trench that contact-connects the source regions. On the other hand, however, the ridge cannot be made arbitrarily wide either since otherwise the insulation layer is not removed on the semiconductor substrate beside the connection trench. This would have the consequence that the full body charge would not be implanted in the region of the residual sections of the insulation layer, which would in turn result in a reduced breakdown voltage. Furthermore, when using this mask there is a process window between the isotropic undercutting of the polysilicon of the first conductive layer under the ridge and the spacing of the cell array trenches, since an etching attack is also effected from the cell array trench. This is desirable, on the one hand, since the polysilicon of the first conductive layer is to be removed in the region of crossover locations between the cell array trenches and the connection trenches, so that the. polysilicon of the second conductive layer, from which the gate electrode structure is formed, is located at the crossover location between cell array trench and connection trench above the polysilicon of the first conductive layer. This is expedient in order that as many connection trenches as desired can be integrated in the cell array. Otherwise the gate electrode structure would have no connection to the gate metallization in the cell array trenches between the connection trenches. On the other hand, however, the undercut must also not be so large that, in the region of the later source contact trench, the material of the first conductive layer in the connection trench no longer reaches to the substrate surface.

Preferably, the ridge covering the connection trench is widened in the region of a crossover location between connection trench and cell array trench, so that the cell array trench is covered in the region of the crossover location. With this mask it is possible to delimit the etching attack from a direction of the cell array trenches. By varying a widening of the ridge in the region of the crossover location, an isotropic undercutting under the ridge may advantageously be set in a controlled fashion.

Preferably, the mask is provided with a ridge covering the connection trench and having a width in a range between the width and triple the width of the connection trench.

The mask is advantageously provided with pads that cover crossover locations between the connection trench and the source contract trenches. In the case of this mask, the polysilicon of the first conductive layer in the connection trench is no longer provided in a manner reaching continuously to the substrate surface. The problem of causing the first conductive layer to recede at crossover locations between the cell array trenches and the connection trench is solved in a simple manner.

In an advantageous manner, in the case of the method for fabricating a power transistor arrangement, provision is made of a mask having a ridge that covers the connection trench and is widened in the region of crossover locations between the connection trench and the cell array trenches. The undercut of the ridge can be set in a controlled fashion with the aid of this mask.

In an advantageous manner, the mask is provided with a ridge covering the connection trench and having a width in a range between the width and triple the width of the connection trench. The body and source regions are implanted before the application of the mask and after the first instance of causing the first conductive layer to recede. The width of the ridge is chosen such that the polysilicon of the first conductive layer in the connection trench reaches to the source contact trench and the undercut in the region of the crossover location between the connection trench and the cell array trench is favorable for the connection of the gate electrode structure. Since the insulation layer on the semiconductor substrate now cannot be removed in a region of the ridge and this is harmful to the implantation of body and source regions, in this method variant the body and source regions are implanted before the application of the mask, after the first instance of causing the first conductive layer to recede.

In an advantageous manner, the mask is provided with pads covering crossover locations between the connection trench and the source contract trenches. An anisotropic dry etching process is carried out for formation of the field electrode structure during the second instance of causing the first conductive layer to recede and, in this case, the first conductive layer is etched back until the cell array trenches are filled as far as a predetermined height. In this method variant, the material of the first conductive layer is etched back anisotropically. In this case, the etching is masked with a resist pad, for example, only in the regions in which the subsequently processed source contact trenches cross the connection trench. In the case of this mask, too, the edge region is covered with a resist layer. The advantage of this variant is that the connection trench does not have to be formed in continuous fashion. It is even possible to integrate as many short connection trenches as desired between the cell array trenches with any desired density in the cell array.

Preferably, one of the masks described is provided and an etching process having anisotropic and isotropic components is employed for causing the first conductive layer to recede for formation of the field electrode structure. With a combination of isotropic and anisotropic components during an etching process, an undercut under the masking of the connection trench and of the edge region can be set in a targeted manner.

The power transistor arrangement according to the invention has at least one cell array formed in a semiconductor substrate, and an edge region adjoining the cell array. Cell array trenches are formed within the cell array and trench transistor cells are formed along the cell array trenches. Two electrode structures that are insulated from one another and from the semiconductor substrate are arranged within a respective cell array trench, one electrode structure being formed as a field electrode structure and the other electrode structure being formed as a gate electrode structure. A gate metallization is arranged above the edge region at least in sections. In this case, the cell array trenches are led out into the edge region and the gate electrode structure is electrically conductively connected to the gate metallization. According to the invention, at least one connection trench crossing the cell array trenches is provided in the cell array. In the region of the connection trench, the field electrode structure is electrically conductively connected to a source metallization arranged above the active cell array.

The advantage of this power transistor arrangement is that, through the connection trench provided in the cell array, the field electrode structure is no longer led out from the trench and connected to a shielding electrode, for example, at the edge, rather the field electrode structure is short-circuited directly through the connection trench with the source metallization arranged above the cell array. A complexity of a structure of the power transistor arrangement is thus reduced. Consequently, the requirements made of lithography processes are also simplified. This leads to a reduction of the susceptibility of the entire process to error and thus to a saving of costs and time in the fabrication of the power transistor arrangement. Since the field electrode structure is short-circuited directly in the cell array with a source metallization, the edge region can be made narrower than in conventional power transistor arrangements. This leads to a further saving, since the power transistor arrangements can be provided such that they are smaller by this area.

Preferably, the edge region encloses the cell array.

In an advantageous manner, the cell array is surrounded at least in sections by edge trenches provided in the edge region, the cell array trenches opening into the edge trenches or being lengthened by the edge trenches. Gate connection trenches adjoining the edge trenches are provided in the edge region. The edge trenches and the gate connection trenches are provided such that they are wider than the cell array trenches and the connection trenches. By virtue of the cell array trenches opening directly into the edge trenches, the gate electrode structure is connected in a simple manner directly to the edge trenches and the gate connection trenches adjoining the latter.

In the text above, the invention has been explained in each case using the example of a trench power transistor arrangement. Over and above this the invention can be extended in an obvious manner to IGBTs, transistor arrangements with a planar structure and those with a drain-up structure.

Furthermore, the invention can be applied to power transistor arrangements with in each case normally on and normally off p-channel and n-channel transistor cells.

The invention is explained in more detail below with reference to FIGS. 1 to 7, in which:

BRIEF DESCRIPTION OF THE DRAWINGS

FIG. 3 shows schematic cross sections through trenches of a power transistor arrangement according to the invention in different stages of an exemplary embodiment of the method according to the invention, FIGS. 4 to 7 show exemplary embodiments of masks according to the invention.

DESCRIPTION

Figure 1:
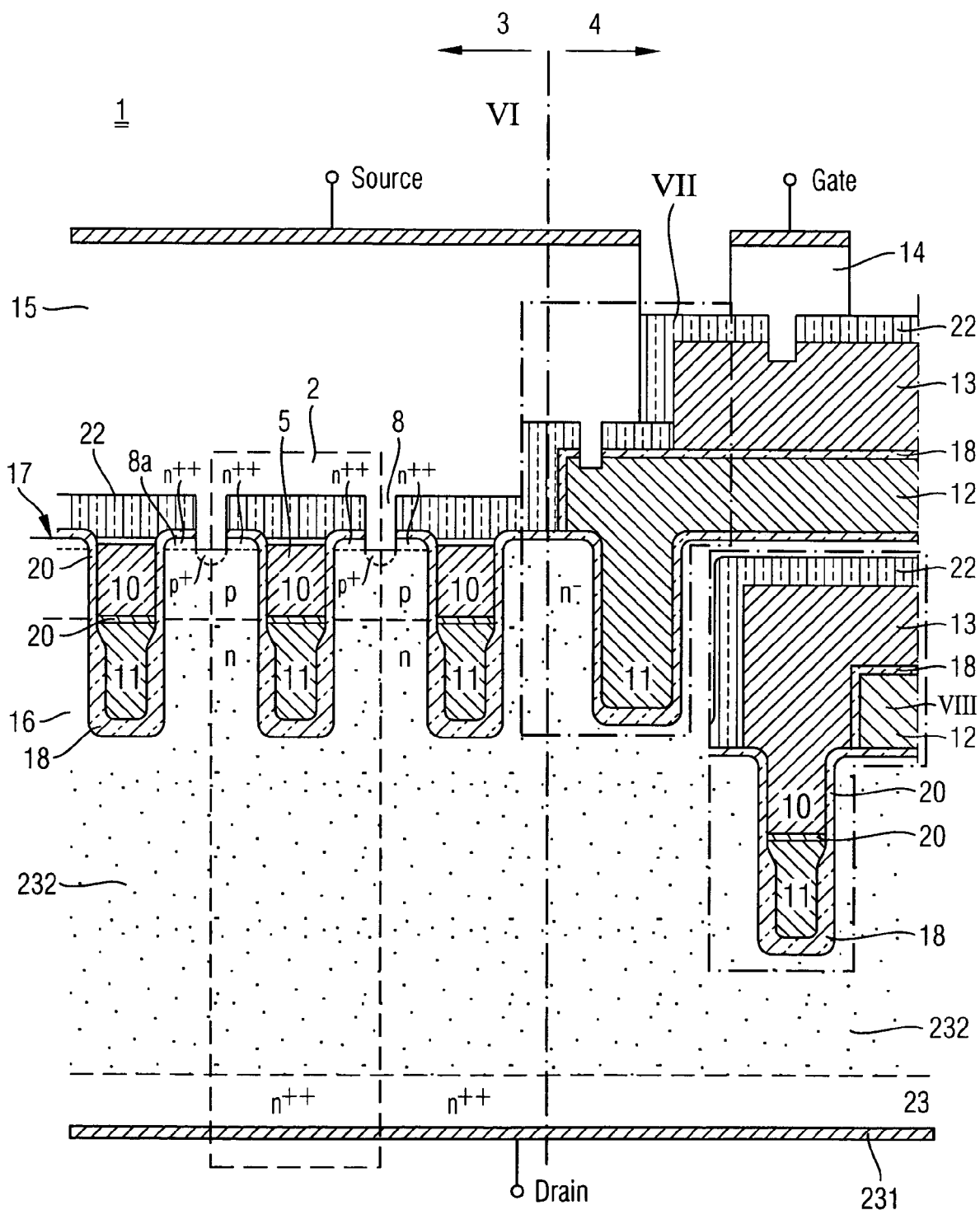
FIG. 1 shows a simplified schematic cross section through a conventional transistor arrangement in the transition region between cell array and edge region.

FIG. 1 has already been explained in greater detail in the introduction to the description.

Reference symbols not represented in the respective figures will be found in FIG. 1.

Figure 2:
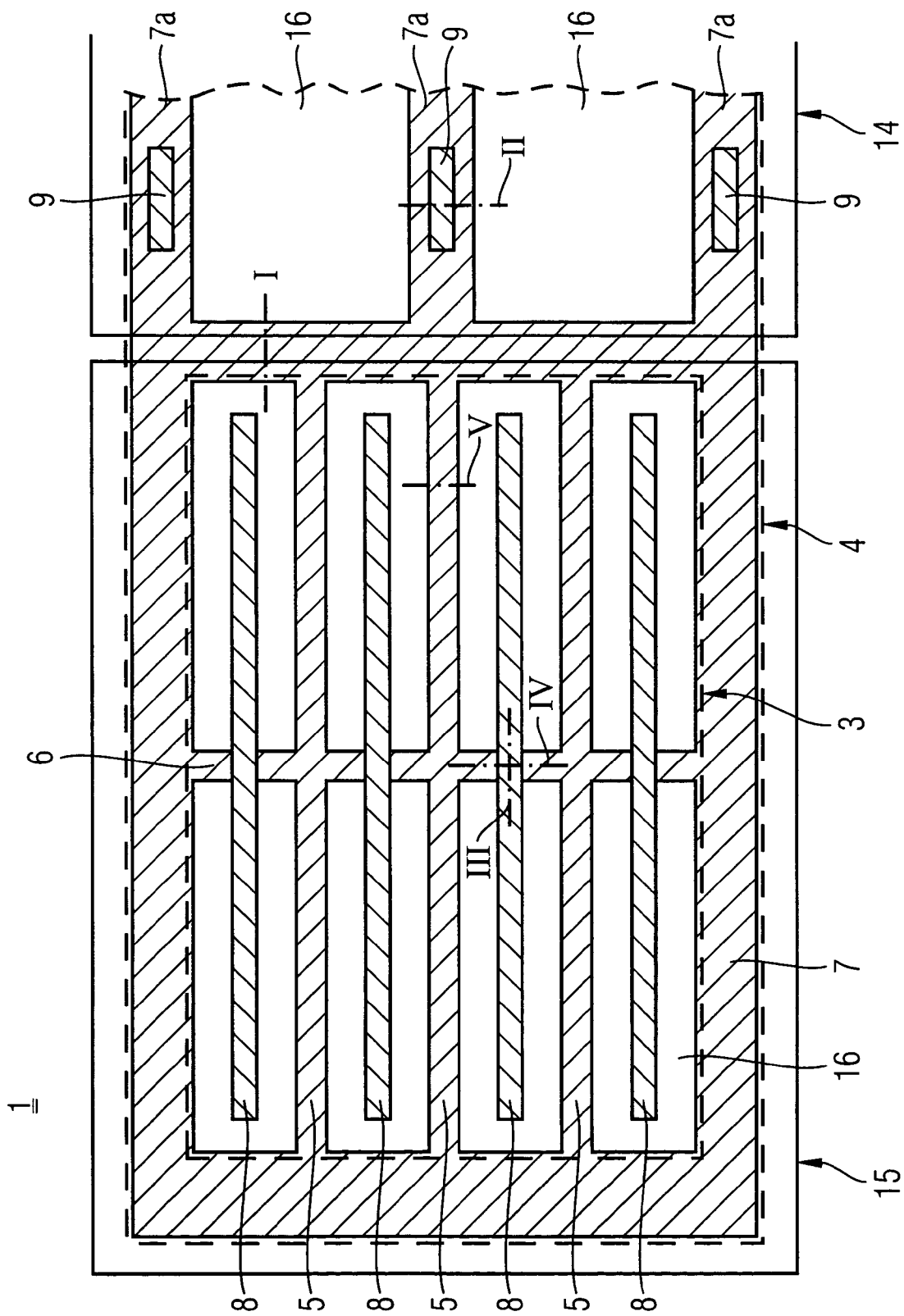
FIG. 2 shows a plan view of a power transistor arrangement in accordance with an exemplary embodiment of the invention.

The power transistor arrangement 1 illustrated as an exemplary embodiment in FIG. 2 has a cell array 3 formed in a semiconductor substrate 16, said cell array being surrounded by an edge region 4. Cell array trenches 5 are formed within the cell array 3 in the semiconductor substrate 16 and trench transistor cells 2 are formed along the cell array trenches 5. The cell array trenches 5 are provided with a width of 0.75 micrometer. Two electrode structures that are insulated from one another and from the semiconductor substrate 16 are arranged in the cell array trenches 5. In this case, one electrode structure is formed as a field electrode structure 11 and the other electrode structure is formed as a gate electrode structure 10. Edge trenches 7 surrounding the cell array 3 and gate connection trenches 7a adjoining the edge trenches 7 are formed in the edge region 4. The edge trenches 7 and the gate connection trenches 7a are provided with a width in the range between 1.5 and 2 times the width of the cell array trenches 5. The gate electrode structure 10 is electrically conductively connected to a gate metallization 14 by the gate connection trenches 7a filled with conductive material and gate contact holes 9 introduced in the region of the gate connection trenches 7a. The cell array trenches 5 open into the edge trenches 7 and are crossed by a connection trench 6, having the same width as the cell array trenches 5, in the cell array 3. The field electrode structure 11 is electrically conductively connected to the connection trench 6 in the cell array 3. Above the connection trench 6, a source contact trench 8 that contact-connects source regions 8a and the connection trench 6 runs parallel to the cell array trenches 5. The connection trench 6 is filled with doped polysilicon, for example, so that it can be contact-connected by the overlying source contact trench 8 and be short-circuited with the source metallization 15.

In the layout illustrated in FIG. 2, the cell array 3 and the edge region 4 are in each case demarcated by a broken line. The edge trenches 7, the gate connection trenches 7a, the cell array trenches 5 and the connection trench 6 are introduced into the semiconductor substrate 16. The source contact trenches 8 run parallel to the cell array trenches 5. Situated above the gate connection trenches 7a are gate contact holes 9 filled with conductive material, which connect the gate electrode structure 10 to the gate metallization 14. The source contact trench 8 filled with conductive material produces the connection of the source regions 8a and of the connection trench 6 to the source metallization 15.

In order to fabricate a power transistor arrangement 1 in accordance with the layout in FIG. 2, edge trenches 7, gate connection trenches 7a, and at least one connection trench 6 are introduced into the semiconductor substrate 16 in a first patterning plane by means of a lithographic imaging and etching process. An insulation layer 18, which may comprise a field oxide, for example, is deposited or grown onto a now patterned substrate surface 17. A first conductive layer 19 made of a highly doped polysilicon is subsequently applied by means of a conformal deposition process. Since the edge trenches 7 and the gate connection trenches 7a are provided such that they are wider than the cell array trenches 5 and the connection trench 6, the wider edge trenches 7 are not completely filled when the cell array trenches 5 and the connection trench 6 are completely filled. In general, the cell array trenches 5 and the connection trenches 6 have the same width.

FIGS. 3a to 3g show the four trenches in each case in cross section: I edge trench 7, II gate connection trench 7a, III connection trench 6, V cell array trench 5. The drawing IV illustrates a longitudinal section through the connection trench 6. FIG. 3a illustrates the semiconductor substrate 16 after patterning of the edge trenches 7, the gate connection trenches 7a, the connection trench 6 and the cell array trenches 5. The insulation layer 18 is applied on the patterned substrate surface 17. The first conductive layer 19 is provided on the insulation layer 18. In the processing state depicted, the connection trench 6 and the cell array trench 5 are completely filled with the conductive layer 19, while the edge trenches 7 and the gate connection trench 7a have an opening.

After the conformal deposition of the doped polysilicon for the first conductive layer 19, the polysilicon is completely removed again from the edge trenches 7 and the gate connection trenches 7a by means of an isotropic etching process and caused to recede in the cell array trenches 5 and in the connection trench 6 as far as the substrate surface 17.

The second patterning plane then ensues. For patterning of a mask 24, a photosensitive resist layer is applied and patterned by means of a lithographic imaging and subsequent etching steps. The resist layer is patterned in such a way as to form a mask 24 covering the edge region 4 and the connection trench 6.

FIG. 3b illustrates the edge trench 7 and the gate connection trench 6 after the complete removal of the first conductive layer 19 and after the application of the mask 24. The polysilicon of the first conductive layer 19 is situated in the connection trench 6, said polysilicon just about reaching the substrate surface 17. The polysilicon is isolated from the semiconductor substrate 16 by the insulation layer 18. The resist ridge 241 can be seen on the polysilicon of the first conductive layer 19 in the connection trench 6. The cell array trench 5 differs from the illustration in FIG. 3a by virtue of the etched-back polysilicon of the first conductive layer 19.

After the application of the mask 24, for formation of the field electrode structure 11, the polysilicon of the first conductive layer 19 is caused to recede as far as a predetermined height in the cell array trenches 5 by means of an isotropic etching process. The field oxide of the insulation layer 18 is then removed wet-chemically at the locations at which the insulation layer 18 is not covered by the mask 24 or by the polysilicon.

FIG. 3c represents the trenches after the removal of the non-masked insulation layer 18 and after causing the polysilicon of the first conductive layer 19 to recede in the cell array trench.

After the removal of the mask 24, a gate insulation layer 20 is applied, which is formed by an oxidation of the semiconductor substrate 16, for example silicon. This is a virtually self-aligning process since the oxide forms only on silicon.

FIG. 3d illustrates the trenches after this process step. The gate insulation layer 20 is formed on the semiconductor substrate 16 in the cell array 3, as can be seen in FIG. 3d I, III, IV and V. The gate insulation layer 20 has been formed on the polysilicon of the first conductive layer 19, as can be gathered from FIG. 3d III, IV and V.

The formation of the gate insulation layer 20 is followed by conformal deposition of a doped polysilicon for the second conductive layer 21 for formation of a gate electrode structure 10.

FIG. 3e shows the trenches after the conformal deposition of the polysilicon of the second conductive layer 21. The edge trench 7 and the gate connection trench 7a are completely filled with polysilicon. In the cell array 3, the cell array trench 5 is filled with the polysilicon of the second conductive layer 21. The polysilicon of the second conductive layer 21 has been deposited above the connection trench 6.

In order to form the gate electrode structure 10, the polysilicon of the second conductive layer 19 is caused to recede as far as the substrate surface 17 by means of an isotropic etching process in the edge trenches 7 and gate connection trenches 7a. The gate insulation layer 20 on the polysilicon of the first conductive layer 19 in the connection trenches 6 acts as an etching stop layer in this case. In the cell array trenches 5, the doped polysilicon of the second conductive layer 21 is caused to recede to just below the substrate surface 17. The illustration of the trenches in FIG. 3f differs from the illustration in FIG. 3e by the fact that the second conductive layer 21 has been caused to recede.

An intermediate oxide layer 22 is deposited, which insulates regions that are not intended to be conductively connected to metal planes that are still to be processed. A third patterning plane with a lithographic imaging is necessary in order to introduce gate contact holes 9 and source contact trench 8 into the intermediate oxide layer 22. After a patterning of the gate contact holes 9 and of the source contact trench 8, they are filled with a doped polysilicon or with a sputtered metal. A fourth patterning plane is subsequently effected in order to provide a gate metallization 14 and a source metallization 15.

FIG. 3g illustrates the trenches after the process steps mentioned have been carried out. The illustration reveals the intermediate oxide layer 22, gate and source metallization 14, 15, the gate contact holes 9 and the source contact trench 8. The first conductive layer 19 formed as field electrode 11 is illustrated in the cell array trench 5, which layer is isolated from the second conductive layer 21, formed as gate electrode 10, by the gate insulation layer 20. Furthermore, the source regions 8a and the p-doped body region are introduced into the semiconductor substrate 16.

Various embodiments can be specified for the mask 24 employed in the method described, with which mask two patterning planes can be combined into one patterning plane, namely the patterning of the first conductive layer 19 forming the field electrode structure 11 and the patterning of the gate insulation layer 20.

Figure 4:
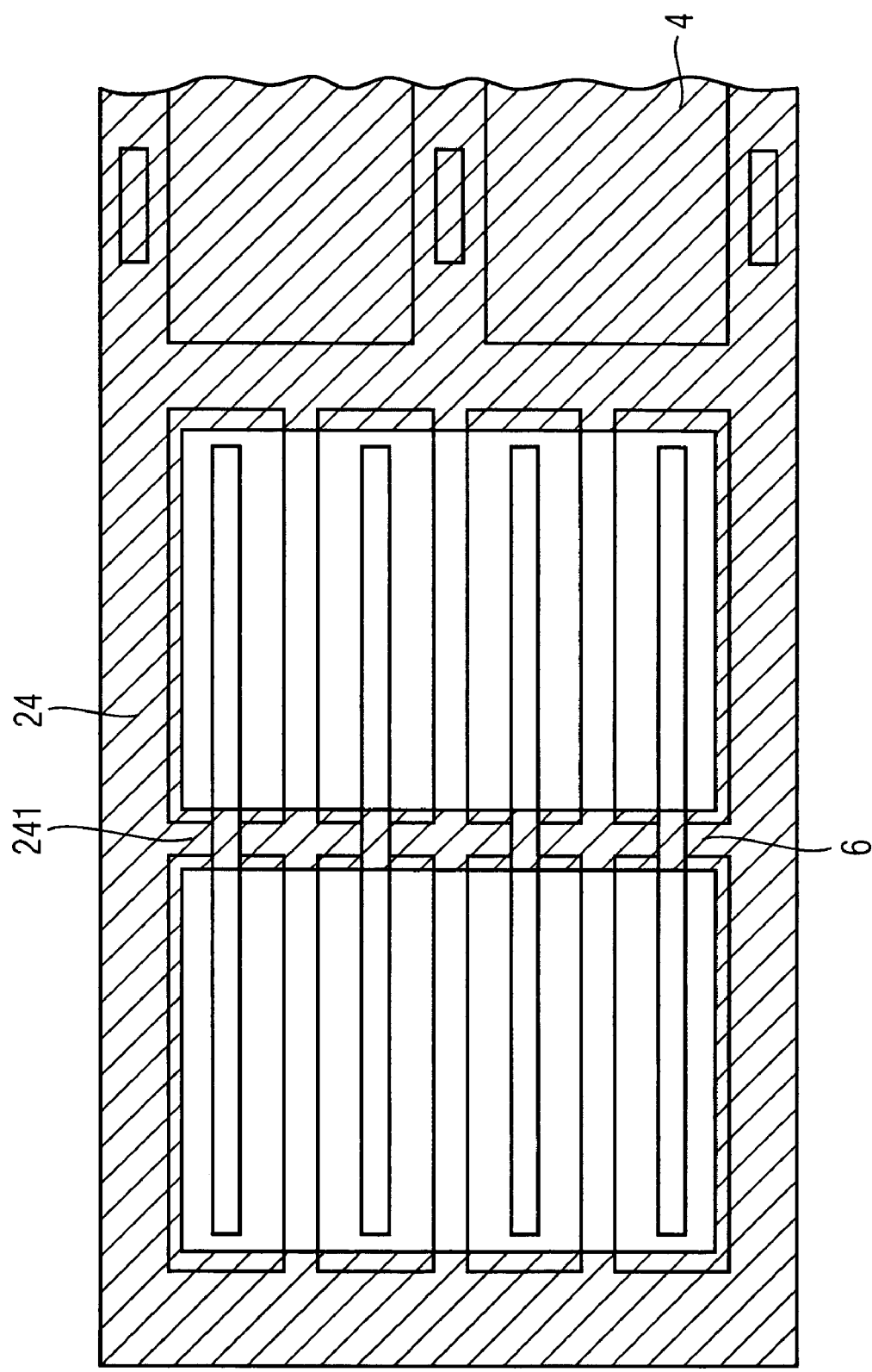

A first exemplary embodiment of the mask 24 is shown in FIG. 4. The mask essentially covers the edge region 4 and the connection trench 6 with a ridge 241.

In the case of this embodiment, it is difficult to set the undercut under the ridge 241 in a controlled manner during the second instance of causing the first conductive layer 19 to recede. The undercut must be controlled such that the polysilicon of the first conductive layer 19 is removed in the region of crossover locations 25 between the connection trench 6 and the cell array trenches 5 in order that the polysilicon in the cell array trench 5 of the second conductive layer 21 forming the gate electrode structure 10 can be placed over the first conductive layer 19. On the other hand, the undercut must not be to such an extent that the polysilicon of the first conductive layer 21 in the connection trench 6 no longer reaches to the source contact trench 8.

Figure 5:
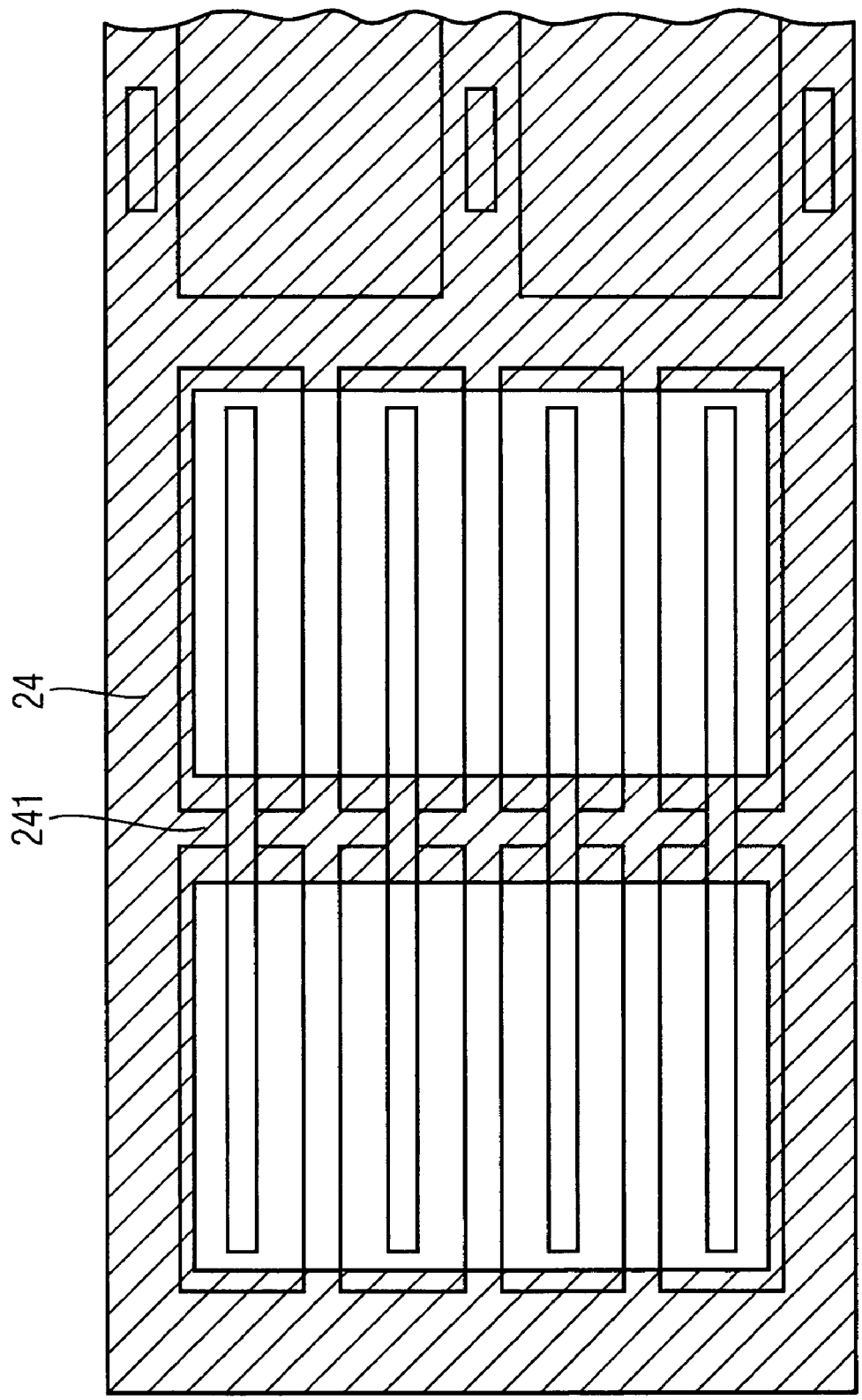

A second exemplary embodiment of a mask 24 is illustrated in FIG. 5. This mask differs from the mask described in FIG. 4 through the widening of the ridge 241.

The widening of the ridge 241 ensures that after the polysilicon of the first conductive layer 19 has been etched back a second time by means of an isotropic etching process, the polysilicon in the connection trench 6 reaches to the source contact trench 8. The width of the ridge 241 varies in a range between the width and triple the width of the connection trench 6 and is chosen such that the undercut in the region of the crossover location 25 between connection trench 6 and cell array trench 5 is favorable for the connection of the gate electrode structure 10. However, since it is not possible to remove the insulation layer 18 on the semiconductor substrate 16 in the region of the ridge 241 and this is harmful to the implantation of body and source regions, when using this mask 24 the body and source regions are implanted before the application of the mask 24, after the first instance of causing the first conductive layer 19 to recede.

Figure 6:
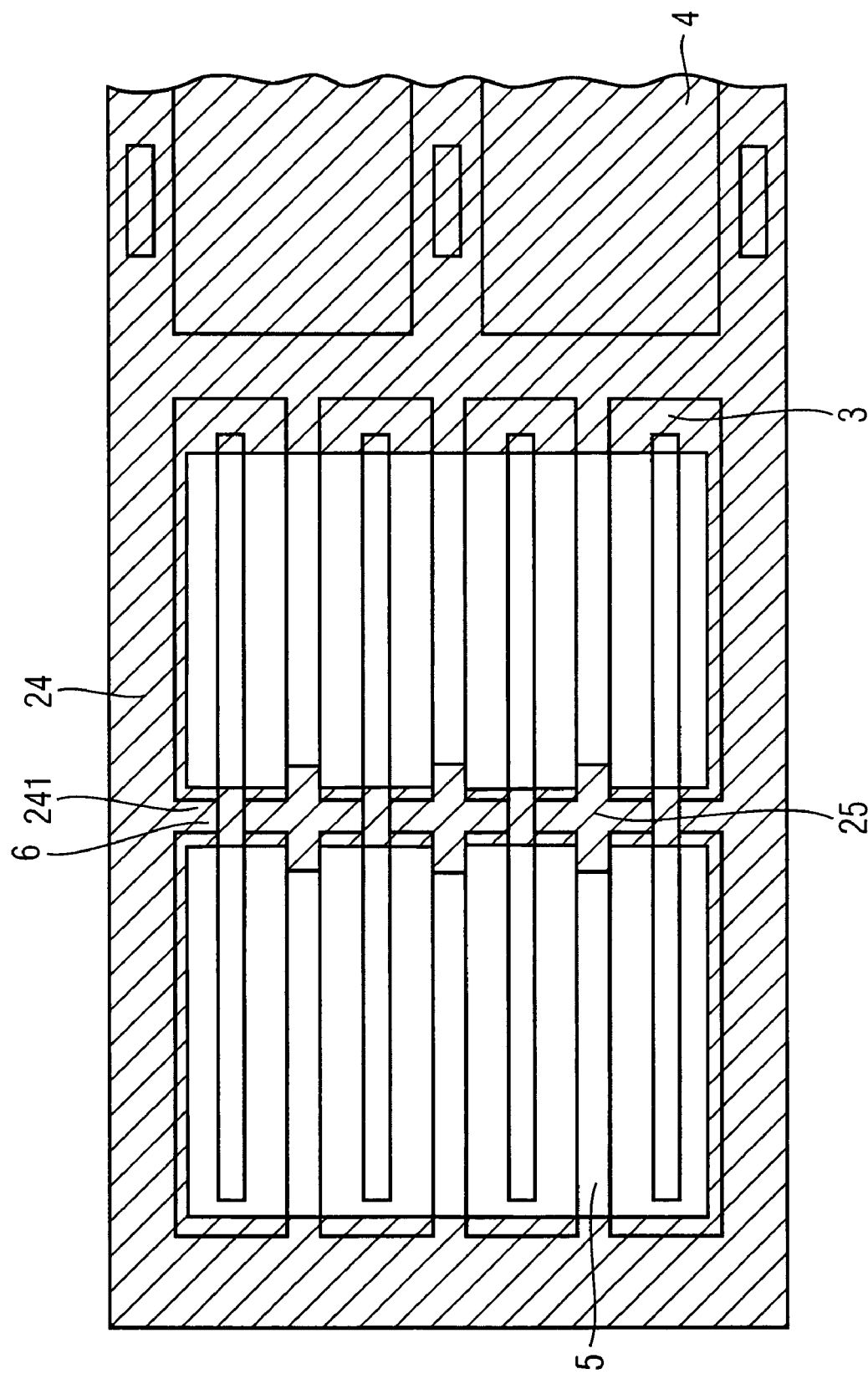

A third exemplary embodiment of a mask 24 is illustrated in FIG. 6. The ridge 241 covering the connection trench 6 is provided with approximately the width of the connection trench 6 and is widened only at the crossover locations 25 between the cell array trenches 5 and the connection trench 6. The etching process can be set in a controlled fashion by varying the width of the ridge 241 at the crossover locations 25. The edge region 4 in the region of the gate connection trenches 7a is covered by the mask 24 in a manner reaching right into the cell array 3. Variations are possible in that region.

A fourth exemplary embodiment of a mask 24 is illustrated in FIG. 7. In this exemplary embodiment, the edge region 4 is covered by the mask 24 and the connection trench 6 is covered by pads 242 in the region of crossover locations 25 between connection trench 6 and source contact trench 8.

In the method variant in which this mask 24 is employed, an anisotropic etching process can be employed when the polysilicon of the first conductive layer 19 is etched back a second time. During the anisotropic etching process, an undercut does not occur under the mask 24 and the pads 242 thereof. It suffices for only the region of the crossover location 25, at which the subsequently processed source contact trench 8 contact-connects the connection trench 6, to be masked with a pad 242 made, for example, of resist. The resist is also present in the edge region 4. By virtue of the fact that, in the case of this method variant, the corners at which the cell array trench 5 and the connection trench 6 meet are not masked, the requirements made of the quality of the gate insulation layer 20 increase.

LIST OF REFERENCE SYMBOLS

1 Power transistor arrangement
2 Trench transistor cell
3 Cell array
4 Edge region
5 Cell array trench
6 Connection trench
7 Edge trench
7a Gate connection trench
8 Source contact trench
8a Source region
9 Gate contact hole
10 Gate electrode structure
11 Field electrode structure
12 Shielding electrode
13 Edge gate structure
14 Gate metallization
15 Source metallization
16 Semiconductor substrate
17 Substrate surface
18 Insulation layer
19 First conductive layer
20 Gate insulation layer
21 Second conductive layer
22 Intermediate oxide layer
23 Drain layer
231 Drain metallization
232 Drift zone
24 Mask
241 Ridge
242 Pad
25 Crossover location

The invention claimed is:

1. A method for fabricating a power transistor arrangement, the method comprising:
providing a cell array in a semiconductor substrate, the semiconductor substrate defining a substrate surface;
providing an edge region adjoining the cell array in the semiconductor substrate;
introducing a plurality of cell array trenches and at least one connection trench within the cell array, the at least one connection trench crossing the plurality of cell array trenches;
introducing at least one edge trench in the edge region, the at least one edge trench adjoining the cell array trenches, and the at least one edge trench being wider than each of the plurality of cell array trenches and the at least one connection trench;
applying an insulation layer;
applying a first conductive layer to the insulation layer, the plurality of cell array trenches and the at least one connection trench being substantially completely filled with the first conductive layer, and the at least one edge trench not being completely filled with the first conductive layer;
removing the first conductive layer from the at least one edge trench and causing the first conductive layer to recede in the cell array substantially to the substrate surface;
applying a mask that covers the edge region and the at least one connection trench;
causing the first conductive layer to recede in the cell array trenches in sections not covered by the mask;
providing a gate insulation layer in the cell array trenches in the sections not covered by the mask, the gate insulation layer provided above the first conductive layer that has been caused to recede and forms a field electrode structure; and
implementing a contact connection of the field electrode structure in the region of the connection trench.

2. The method of claim 1 wherein the step of providing the gate insulation layer comprises patterning the gate insulation layer including the steps of
removing sections of the insulation layer that are covered neither by the mask nor by the first conductive layer;
removing the mask; and
providing the gate insulation layer by oxidation of a semiconductor material.

3. The method of claim 2 wherein the step of removing sections of the insulation layer that are covered neither by the mask nor by the first conductive layer comprises a wet-chemical etching process.

4. The method of claim 1 further comprising the steps of:
applying a second conductive layer after the application of the gate insulation layer, the second conductive layer forming a gate electrode structure;
etching back the second conductive layer substantially to the substrate surface such that the cell array trenches are substantially completely filled;
applying an intermediate oxide layer to the cell array and the edge region;
providing source contact trenches in the intermediate oxide layer in the cell array, the source contact trenches operable to provide for the contact connection of source regions and of the connection trench;
providing gate contact holes in the intermediate oxide layer in the edge region, the gate contact holes operable to provide for the contact connection of the gate electrode structure;
providing a gate metallization above the edge region; and
providing a source metallization above the cell array.

5. The method of claim 4 wherein the second conductive layer comprises doped polysilicon.

6. The method of claim 1 wherein the at least one edge trench comprises a plurality of edge trenches and at least one gate connection trench adjoins the edge trenches, the at least one gate connection trenches having substantially the same width as each of the plurality of edge trenches.

7. The method of claim 6 wherein the step of applying the second conductive layer comprises a conformal deposition process and wherein the thickness of the second conductive layer is such that the plurality of edge trenches and the at least one gate connection trench are substantially completely filled.

8. The method of claim 1 wherein the step of applying the insulation layer comprises depositing or growing a field oxide.

9. The method of claim 1 wherein the step of applying the first conductive layer comprises conformal deposition of doped polysilicon.

10. The method of claim 1 wherein the step of causing the first conductive layer to recede in the cell array substantially to the substrate surface comprises an isotropic etching process.

11. The method of claims 1 wherein the step of causing the first conductive layer to recede in the cell array trenches in sections not covered by the mask comprises an isotropic dry etching process.

12. The method of claim 1 further comprising the step of introducing body regions and source regions into the semiconductor substrate, the step of introducing body regions and source regions including implantation of atoms and subsequent heating.

13. The method of claim 12 wherein the body and source regions are implanted before the application of the mask and after partial removal of the first conductive layer.

14. The method of claim 1 wherein the step of applying a mask comprises applying a photosensitive resist layer; imaging onto the resist layer a structure provided for the mask including use of an exposure mask having the structure and use of a lithography method; and patterning the resist layer using an etching process.

15. The method of claim 14 wherein the mask substantially covers the edge region and substantially covers the at least one connection trench.

16. The method of claim 15 wherein the mask includes a ridge covering the at least one connection trench and has a width of substantially the width of the at least one connection trench.

17. The method of claim 16 wherein the ridge is widened in the region of a crossover location between the at least one connection trench and one of the plurality of cell array trenches.

18. The method of claim 15 wherein the mask includes a ridge covering the at least one connection trench and has a width in a range from the width of the at least one connection trench to triple the width of the at least one connection trench.

19. The method of claim 15 wherein the mask includes a plurality of pads covering a plurality of crossover locations between the at least one connection trench and at least one source contact trench.

20. The method of claim 1 wherein an anisotropic dry etching process is employed for partial removal of the first conductive layer for formation of the field electrode structure, and the first conductive layer is etched back until the plurality of cell array trenches are filled to a predetermined height.

21. The method of claim 1 wherein an etching process combined from anisotropic and isotropic components is employed for partial removal of the first conductive layer for formation of the field electrode structure.

22. The method of claim 1, wherein the step of removing the first conductive layer includes completely removing the first conductive layer from the at least one edge trench.

23. The method of claim 1, wherein the steps of removing the first conductive layer and causing the first conductive layer to recede, applying a mask, causing the first conductive layer to recede in sections not covered by the mask, providing a gate insulation layer and implementing a contact connection occur in sequential order.

* * * * *